US008354785B2

(12) United States Patent
Clough et al.

(10) Patent No.: US 8,354,785 B2
(45) Date of Patent: Jan. 15, 2013

(54) NANOCRYSTALS INCLUDING A GROUP IIIA ELEMENT AND A GROUP VA ELEMENT, METHOD, COMPOSITION, DEVICE AND OTHER PRODUCTS

(75) Inventors: Christopher R. Clough, East Cambridge, MA (US); Craig Breen, Somerville, MA (US); Jonathan S. Steckel, Bedford, MA (US); Ebenezer Selwyn Arun Thambaw, Sayoy, IL (US)

(73) Assignee: QD Vision, Inc., Lexington, MA (US)

( * ) Notice: Subject to any disclaimer, the term of this patent is extended or adjusted under 35 U.S.C. 154(b) by 77 days.

(21) Appl. No.: 12/454,706

(22) Filed: May 21, 2009

(65) Prior Publication Data
US 2010/0052512 A1 Mar. 4, 2010

Related U.S. Application Data

(63) Continuation of application No. PCT/US2007/024320, filed on Nov. 21, 2007.

(60) Provisional application No. 60/866,822, filed on Nov. 21, 2006.

(51) Int. Cl.
*H05B 33/00* (2006.01)
(52) U.S. Cl. .......................... 313/498; 428/403; 313/503
(58) Field of Classification Search .................... 257/40; 252/301.4 R, 301.6 S; 428/403, 209; 117/68; 438/478
See application file for complete search history.

(56) References Cited

U.S. PATENT DOCUMENTS

| | | | |
|---|---|---|---|
| 4,525,214 A * | 6/1985 | Panken | 106/31.08 |
| 4,556,818 A | 12/1985 | Ozawa | |
| 4,584,174 A | 4/1986 | Morioka et al. | |
| 1,789,701 A | 12/1988 | Taylor | |
| 5,023,139 A | 6/1991 | Birnboim et al. | |
| 5,051,786 A | 9/1991 | Nicollian et al. | |
| 5,079,186 A | 1/1992 | Narusawa | |
| 5,084,128 A | 1/1992 | Baker | |
| 5,162,939 A | 11/1992 | Herron et al. | |
| 5,229,170 A | 7/1993 | Narusawa | |
| 5,474,591 A | 12/1995 | Wells et al. | |
| 5,505,928 A | 4/1996 | Alivisatos et al. | |
| 5,525,377 A | 6/1996 | Gallagher et al. | |
| 5,537,000 A | 7/1996 | Alivisatos et al. | |
| 5,908,608 A | 6/1999 | Lawandy et al. | |
| 6,106,609 A | 8/2000 | Yang et al. | |
| 6,179,912 B1 | 1/2001 | Barbera-Guillem et al. | |
| 6,207,229 B1 | 3/2001 | Bawendi et al. | |
| 6,225,198 B1 | 5/2001 | Alivisatos et al. | |
| 6,251,303 B1 | 6/2001 | Bawendi et al. | |
| 6,306,610 B1 | 10/2001 | Bawendi et al. | |
| 6,306,736 B1 | 10/2001 | Alivisatos et al. | |
| 6,319,426 B1 | 11/2001 | Bawendi et al. | |
| 6,322,901 B1 | 11/2001 | Bawendi et al. | |
| 6,326,144 B1 | 12/2001 | Bawendi et al. | |
| 6,329,668 B1 | 12/2001 | Razeghi | |
| 6,379,635 B2 | 4/2002 | O'Brien et al. | |
| 6,444,143 B2 | 9/2002 | Bawendi et al. | |
| 6,445,009 B1 | 9/2002 | Grandjean et al. | |
| 6,472,389 B1 * | 10/2002 | Ohtani et al. | 514/233.2 |
| 6,576,291 B2 | 6/2003 | Bawendi et al. | |
| 6,617,583 B1 | 9/2003 | Bawendi et al. | |
| 6,645,885 B2 | 11/2003 | Chua et al. | |
| 6,682,596 B2 | 1/2004 | Zehnder et al. | |
| 6,803,719 B1 | 10/2004 | Miller et al. | |
| 6,815,064 B2 | 11/2004 | Treadway et al. | |
| 6,821,337 B2 | 11/2004 | Bawendi et al. | |
| 6,846,565 B2 | 1/2005 | Korgel et al. | |
| 6,849,862 B2 | 2/2005 | Nikolaev et al. | |
| 6,869,545 B2 | 3/2005 | Peng et al. | |
| 6,872,249 B2 * | 3/2005 | Peng et al. | 117/68 |

(Continued)

FOREIGN PATENT DOCUMENTS
EP 0109628 5/1984
(Continued)

OTHER PUBLICATIONS

Adachi et al., Appl. Phys. Lett. 78, 1622 (2001). Adam, S. et al., "The effect of nanocrystal surface structure on the luminescence properties: Photoemission study of HF-etched InP nanocrystals" Journal of Chemical Physics, 123, 2005.
Aharoni, A., et al, "Synthesis of InAs/CdSe/ZnSe Core/Shell1/Shell2 Structures with Bright and Stable Near-Infared Fluorescence" J.Am. Chem. Soc. 2006, 128, 257-264.
Battaglia, D., et al., "Formation of High Quality InP an dinAs Nanocrystals in a Noncoordinating Solvent", Nano Letters, 2002, vol. 2, No. 9, 1027-1030.
Borchert, H. et al., "Investigation of ZnS Passivated InP Nanocrystals by XPS", Nano Letters 2002 vol. 2, No. 2 151-154.

(Continued)

*Primary Examiner* — Nimesh Patel
*Assistant Examiner* — Mary Ellen Bowman

(57) ABSTRACT

A nanocrystal comprising a semiconductor material comprising one or more elements of Group IIIA of the Periodic Table of Elements and one or more elements of Group VA of the Periodic Table of Elements, wherein the nanocrystal is capable of emitting light having a photoluminescence quantum efficiency of at least about 30% upon excitation. Also disclosed is a nanocrystal including a core comprising a first semiconductor material comprising one or more elements of Group IIIA of the Periodic Table of Elements and one or more elements of Group VA of the Periodic Table of Elements, and a shell disposed over at least a portion of the core, the shell comprising a second semiconductor material, wherein the nanocrystal is capable of emitting light having a photoluminescence quantum efficiency of at least about 30% upon excitation. Also disclosed is a nanocrystal comprising a nanocrystal core and a shell comprising a semiconductor material disposed on at least a portion of the nanocrystal core, wherein the semiconductor material comprises at least three chemical elements and is obtainable by a process comprising adding a precursor for at least one of the chemical elements of the semiconductor material from a separate source to a nanocrystal core while simultaneously adding amounts of precursors for the other chemical elements of the semiconductor material. A population of nanocrystals, method for preparing nanocrystals, compositions, and devices including nanocrystals are also disclosed.

49 Claims, No Drawings

U.S. PATENT DOCUMENTS

| | | |
|---|---|---|
| 7,056,471 B1 | 6/2006 | Han et al. |
| 7,105,051 B2 | 9/2006 | Peng et al. |
| 7,147,712 B2 | 12/2006 | Zehnder et al. |
| 7,160,613 B2 | 1/2007 | Bawendi et al. |
| 7,172,791 B2 | 2/2007 | Treadway et al. |
| 7,250,082 B2 | 7/2007 | Jang et al. |
| 7,288,468 B2 | 10/2007 | Jang et al. |
| 7,332,211 B1 | 2/2008 | Bulovic et al. |
| 7,557,028 B1 | 7/2009 | Scher et al. |
| 7,621,997 B2 | 11/2009 | Jun et al. |
| 7,919,012 B2 | 4/2011 | Peng et al. |
| 8,062,967 B1 | 11/2011 | Scher et al. |
| 8,101,234 B2 | 1/2012 | Bawendi et al. |
| 8,134,175 B2 | 3/2012 | Bawendi et al. |
| 8,158,193 B2 | 4/2012 | Bawendi et al. |
| 2001/0040232 A1 | 11/2001 | Bawendi et al. |
| 2001/0055764 A1 | 12/2001 | Empedocles et al. |
| 2002/0004246 A1 | 1/2002 | Daniels et al. |
| 2002/0066401 A1 | 6/2002 | Peng et al. |
| 2002/0071952 A1 | 6/2002 | Bawendi et al. |
| 2003/0010987 A1 | 1/2003 | Banin et al. |
| 2003/0173541 A1* | 9/2003 | Peng et al. ............. 252/301.4 R |
| 2003/0209105 A1 | 11/2003 | Bawendi et al. |
| 2004/0023010 A1* | 2/2004 | Bulovic et al. ................ 428/209 |
| 2004/0033359 A1 | 2/2004 | Bawendi et al. |
| 2004/0091710 A1 | 5/2004 | Bawendi et al. |
| 2004/0110002 A1 | 6/2004 | Kim et al. |
| 2004/0122248 A1 | 6/2004 | Shenai-Khatkhate et al. |
| 2005/0002635 A1 | 1/2005 | Banin et al. |
| 2005/0072989 A1 | 4/2005 | Bawendi et al. |
| 2005/0088380 A1 | 4/2005 | Bulovic et al. |
| 2005/0112849 A1* | 5/2005 | Stott et al. ..................... 438/478 |
| 2005/0119105 A1 | 6/2005 | Zimmer et al. |
| 2005/0120946 A1* | 6/2005 | Hines et al. ..................... 117/68 |
| 2005/0123765 A1 | 6/2005 | Ong et al. |
| 2005/0129947 A1* | 6/2005 | Peng et al. ..................... 428/403 |
| 2005/0136258 A1 | 6/2005 | Nie et al. |
| 2005/0209123 A1 | 9/2005 | Laux |
| 2005/0214536 A1 | 9/2005 | Schrier et al. |
| 2005/0258418 A1* | 11/2005 | Steckel et al. ................... 257/40 |
| 2006/0001119 A1 | 1/2006 | Liu et al. |
| 2006/0006396 A1 | 1/2006 | Chua et al. |
| 2006/0110279 A1 | 5/2006 | Han et al. |
| 2006/0110313 A1 | 5/2006 | Cho et al. |
| 2006/0130741 A1 | 6/2006 | Peng et al. |
| 2006/0157720 A1 | 7/2006 | Bawendi et al. |
| 2006/0196375 A1 | 9/2006 | Coe-Sullivan et al. |
| 2006/0202167 A1 | 9/2006 | Landry et al. |
| 2007/0049765 A1 | 3/2007 | Lucey et al. |
| 2007/0103068 A1 | 5/2007 | Bawendi et al. |
| 2007/0197003 A1 | 8/2007 | Yen et al. |
| 2007/0243382 A1 | 10/2007 | Chan et al. |
| 2007/0289491 A1 | 12/2007 | Peng et al. |
| 2008/0001167 A1 | 1/2008 | Coe-Sullivan et al. |
| 2008/0038558 A1 | 2/2008 | Landry et al. |
| 2008/0074050 A1 | 3/2008 | Chen et al. |
| 2008/0169753 A1 | 7/2008 | Skipor et al. |
| 2008/0172197 A1 | 7/2008 | Skipor et al. |
| 2008/0202383 A1 | 8/2008 | Shi |
| 2008/0247932 A1 | 10/2008 | Li et al. |
| 2009/0001385 A1 | 1/2009 | Skipor et al. |
| 2009/0001403 A1 | 1/2009 | Skipor et al. |
| 2009/0002806 A1 | 1/2009 | Skipor et al. |
| 2009/0017268 A1 | 1/2009 | Skipor et al. |
| 2009/0059554 A1 | 3/2009 | Skipor et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0230382 A1 | 9/2009 | Banin et al. |
| 2009/0251759 A1 | 10/2009 | Domash et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan |
| 2010/0001256 A1 | 1/2010 | Coe-Sullivan et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0068468 A1 | 3/2010 | Coe-Sullivan et al. |
| 2010/0090164 A1 | 4/2010 | Peng et al. |
| 2010/0132770 A1 | 6/2010 | Beatty et al. |
| 2010/0134520 A1 | 6/2010 | Coe-Sullivan et al. |
| 2010/0243053 A1 | 9/2010 | Coe-Sullivan et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289001 A1 | 11/2010 | Kahen et al. |
| 2010/0289003 A1 | 11/2010 | Kahen et al. |
| 2010/0314646 A1 | 12/2010 | Breen et al. |
| 2011/0081538 A1 | 4/2011 | Linton |
| 2011/0095261 A1 | 4/2011 | Kazlas |
| 2011/0127932 A1 | 6/2011 | Halpert et al. |
| 2011/0129420 A1 | 6/2011 | Allen et al. |

FOREIGN PATENT DOCUMENTS

| | | |
|---|---|---|
| JP | 38076110 | 4/1991 |
| WO | WO 03/050329 | 6/2003 |
| WO | WO 2004/066361 | 8/2004 |
| WO | WO 2005/002007 | 1/2005 |
| WO | WO 2006/076290 | 7/2006 |
| WO | WO 2008/133660 | 11/2008 |
| WO | WO 2009/097319 | 8/2009 |
| WO | WO 2011/100023 | 8/2011 |

OTHER PUBLICATIONS

Byrne, E.K., et al., "Design of a Monomeric Arsinogallane and Chemical Conversion to Gallium Arsenide", Science, vol. 241, 332-333 (1988).

Cao, et al., "Synthesis and Characterization of InAs/InP and InAs/CdSe Core/Shell Nanocrystals", Communication—Angew. Chem. Int. Ed. 1999, 38, No. 24.

Cao, et al., "Growth and Properties of Semiconductor Core/Shell Nanocrystals with InAs Cores" Journal of the American Chemical Society, 2000, 122 (40) 9692-9702.

Chen, Chia-Chun, et al., "Syntheses of Soluble GaN Nanocrystals by a Solution-Phase Reaction" Tamkang Journal of Science and Engineering, vol. 5, No. 4, pp. 223-226 (2002).

Dabbousi, et al, <<(CdSe)ZnS Core-Shell Quantum Dots : Synthesis and Characterization of a Size Series of Highly Luminescent Nanocrystallites>>, J. Phys. Chem., 101, 9463 (1997).

Directive 2002/95/EC of the EU Parliament and of the Council of Jan. 27, 2003 on the restriction of the use of certain hazardous substances in electrical and electronic equipment.

Dirr et al., Jpn. J. Appl. Phys. 37, 1457 (1998).

Deppert, K. et al., "Aerosol Fabrication of Nanocrystals of InP" Jpn-J. Appl. Phys. vol. No: 38.

Douglas, T., et al., "Molecular Precursors for Indium Phosphide and Synthesis of Small III-V Semiconductor Clusters in Solution", Inorg. Chem., 1991, 30, 594-596.

Furis, M. et al., "Spectroscopy Studies of InP Nanocrystals Synthesized Through a Fast Reaction", Mat. Res. Soc. Symp. Proc. vol. 789 (N3.35.1- N3.35.6) 2004.

Green, M. et al., "The synthesis of III-V semiconductor nanoparticles using indium and gallium diorganophosphides as single-molecular precursors" J. Mater. Chem. 2004, 14, 629-636.

Green, M., "Solution routes to III-V semiconductor quantum dots", Science Direct—2002.

Guzelian, A. et al., "Synthesis of Size-Selected, Surface-Passivated InP Nanocrystals", J. Phys. Chem. 1996, 100, 7212-7219.

Guzelian, A. et al., "Colloidal chemical synthesis and characterization of InAs nanocrystal quantum dots", Appl. Phys. Lett., 69 (10), 1432-1434, Sep. 2, 1996.

Haubold, S., "Strongly Luminescent InP/ZnS Core-Shell Nanoparticles", Chem Phys Chem 2001, No. 5 vol. 2, Issue 5, pp. 331-334 Chem Phys Chem (2001).

Healy, M.D., et al., "The Reaction of Indium(III) chloride with Tris (trimethylsilyl) phosphine:A Novel Route to Indium Phosphide", J. Chem. Soc., Chem. Commun., 1989 359-360.

Hines, M. et al., "Synthesis and Characterization of Strongly Luminescing ZnS-Capped CdSe Nanocrystals" J. Phys. Chem. 1996, 100, 468-471.

Hollingsworth, et al., "Soft Chemical Synthesis and Manipulation of Semiconductor Nanocrystals" in Semiconductor and Metal nanocrystals: Synthesis and Electronic and Optical Properties, Klimov, ed. Marcel Dekker, pp. 1-64.

Janik, J. F. et al., "New InP/Zn5 core-shell nanoparticles" Chem. Phys. Chem, 2001.

Kan, S. et al., "Shape control of III-V semiconductor nanocrystals: synthesis and properties of InAs quantum rods" Faraday Discussions, 2004, 125, 23-38.

Kher, S. et al., "A Straightforward, New Method for the Synthesis of Nanocrystalline GaAs and GaP" Chem. Mater. 1994, 6, 2056-2062.

Kim, Sang-Wook; et al. "Engineering InAsxP1-xInP/ZnSe III-V Alloyed Core/Shell Quantum Dots for the Near-Infrared" J.Am. Chem. Soc. 2005, 127, 10526-10532.

Kim, Y-H., et al, "Sterically Induced Shape and Crystalline Phase Control of GaP Nanocrystals" J. Am. Chem. Soc 2002, 124, 13656-13657.

Kumar, S. et al., "Synthesis and electrochemical properties of InP nanocrystals", J. Mater. Res., vol. 21, No. 3, 543-546, Mar. 2006.

Lucey, D. et al., "Monodispersed InP Quantum Dots Prepared by Colloidal Chemistry in a Noncoordinating Solvent" Chemistry of Materials 2005, 17 (14) 3754-3762.

MacDougall, J.E., et al., "Synthesis and Characterization of III-V Semiconductor Clusters: GaP in Zeolite Y", J. Am. Chem. Soc. 1989, 111, 8006-8007.

Micic, O. I, et al., "Synthesis and Characterization of InP, GaP, and GaInP$_2$ Quantum Dots", J. Phys. Chem., 1995, 99, 7754-7759.

Micic, O., et al., "Synthesis and Characterization of InP Quantum Dots" J. Phys. Chem. 1994, 98, 4966-4969.

Micic, O., et al., "Core-Shell Quantum Dots of Lattice-Matched ZnCdSe2 Shells on InP Cores: Experiment and Theory", I. Phys. Chem. B 2000, 104, 12149-12156.

Micic, Olga I.; et al. "Synthesis of extremely small InP quantum dots and electronic Coupling in their Disordered Solid Films" Applied Physics Letters vol. 78, No. 25 Jun. 18, 2001.

Moreels, I., et al, "Ligand adsorption/desorption on sterically stabilized InP colloidal nanocrystals: observation and termodynamic analysis", Chem. Phys. Chem., 2006, 7, 1028-1031.

Murray, J. Amer, Chem. Soc., 115, 8706 (1993).

Murray, Christopher Bruce, MIT PhD Thesis, entitled "Synthesis and Characterization of II-VI Quantum Dots and Their Assembly into 3D Quantum dot Superlattices" Sep. 1993.

Micic, O. I, et al., "Synthesis and Characterization of InP, GaP, and GaInP2 Quantum Dots", J. Phys. Chem., 1995, 99, 7754-7759.

Nedeljkovlc, J. et al., "Growth of InP Nanostructures via Reaction of Indium Droplets with Phosphide Ions: Synthesis of InP Quantum Rods and InP-1102 Composites" J Amer Chem Soc 2004, 126 (8), 2632-2639.

Nozik, Arthus J., et al, "Colloidal Quantum Dots of III-V Semiconductors" MRS Bulletin/Feb. 1998.

Olshaysky, M, et al., "Organometallic Synthesis of GaAs Crystallites Exhibiting Quantum Confinement" J. Am. Chem. Soc. 1990, 112, 9438-9439.

PCT International Preliminary Report on Patentability in parent International Application No. PCT/US2007/024320.

PCT International Preliminary Report on Patentability in International Application No. PCT/US2010/59931 of QD Vision, et al.

Peng, X. et al., "Kinetics of II-VI and III-V Colloidal Semiconductor Nanocrystal Growth: "Focusing" of Size Distributions", J. Am. Chem. Soc. 1998, 120, 5342-5344.

Reiss, P., "Core/shell semiconductor nanocrystals", small, 2009, 5, No. 2, 154-168.

Ryu, Euidock; et al. "Step-Wise Synthesis of InP/ZnS Core-Shell Qunatum Dots and the Role of Zinc Acetate", Chem. Of Materials, 2009, vol. 21, No. 4, pp. 573-575.

Sandroff, C.J., et al., "GaAs Clusters in the Quantum Size Regime: Growth on High Surface Area Silica by Molecular Beam Epitaxy", Science, vol. 245, 391-393, Jul. 28, 1989.

Shweky, et al., "Seeded growth of InP and InAs quantum rods using indium acetate and myristic acid" Mater. Science & Engineering, 2006, 26 (5-7).

Shweky, I. et al., "Synthesis of InP and InAs quantum rods using Indium Acetate and Myristic acid", Mater. Res. Soc. Symp. Proc. vol. 848 2005.

Talapin, D. et al., "Dynamic Distribution of Growth Rates within the Ensembles of Colloidal II-VI and III-V Semiconductor Nanocrystals as a Factor Governing Their Photoluminescence Efficiency" J. Am. Chem. Soc., 2002, 124, 5782-5790.

Trikalitis, et al., "Mesostructured cobalt and nickel molybdenum sulfides" Microporous and Mesopporous Materials [Online] Available on line Nov. 2, 2005, vol. 88, Iss 1-3, pp. 187-190.

Vugt, V. et al., "Increase of the Photoluminescence Intensity of InP Nanowires by Photoassisted Surface Passivation" Journal of the American Chemical Society 2005, 127 (35).

Wei, S., et al., "InP nanocrystals via surfactant-aided hydrothermal synthesis", Journal of Applied Physics, Apr. 1, 2004 vol. 95, Issue 7, pp. 3683-3688.

Wells, R. et al., "Pathways to Nanocrystalline III-V (13-15) Compound Semiconductors" Journal of Cluster Science. vol. 8, No. 2, 1997, pp. 217-238.

Wells, R. et al., "Use of Tris (trimethylsilyl) arsine to Prepare Gallium Arsenide and Indium Arsenide" Chemistry of Materials 1989, 1, 4-6.

Xie, r., et al., "Colloidal InP Nanocrystals as Efficient Emitters Covering Blue to Near-Infrared", J. Am. Chem. Soc., 2007, 129, 15432-15433.

Xu, S., et al, "Rapid Synthesis of High-Quality InP Nanocrystals", J. Amer. Chem. Soc., 2006, 128, 1054-1055.

Yamasaki et al., Appl. Phys. Lett. 76, 1243 (2000).

Zimmer, J.P., et al., Size series of small indium arsenide-sinc selenide core-shell nanocrystals and their application to in vivo imaging, J. Am. Chem. Sco., 2006, 128, 2526-2527.

Zimmer, J.P., et al., Supporting Information for J. Am. Chem. Sco., 2006, 128, 2526-2527.

Adachi, S., "Optical dispersion relations for GaP, GaAs, GaSb, InP, InAs, InSb, AlxGa1-xAs, and $Int_{1-x}As_yP_{1-y}$", J. Appl. Phys. 1989, vol. 66, Issue 12, pp. 6030-6040.

Cao, Y-W., et al., "Synthesis and Characterization of InAs/InP and InAs/CdSe Core/Shell Nanocrystals", Angew. Chem. Int. Ed., 1999, 38, No. 24.

Green, M., et al., "On the synthesis and manipulation of InAs quantum dots", J. Mater. Chem., 2000, 10, 1939-1943.

Hatami, F.,et al.,"Carrier dynamics in type-II GaSb/GaAs quantum dots", Phys. Rev. B, vol. 57, No. 8, 4635 (Feb. 15, 1998-II).

Lu, J., et al., "Hydrothermal route to InAs semiconductor nanocrystals", Inorg. Chem. 2004, 43, 4543-4545.

Salata, O.V., et al., "Uniform GaAs quantum dots in a polymer matrix", Appl. Phys. Lett., 65 (2), Jul. 11, 1994.

Uchida, H., et al., "Optical properties of GaAs nanocrystals", J. Phys. Chem., 1992, 96, 1156-1160.

Uchida, H., et al., "Preparation and optical nonlinearity of quantized InAs", Chem. Mater., 1993, 5, 716-719.

Voland et al., "X-ray Diffraction Studies of Interdiffusion in InP-GaP Powder Blends", Cryst. Res. Technol. 1989, 24, 1177-1185.

* cited by examiner

NANOCRYSTALS INCLUDING A GROUP IIIA ELEMENT AND A GROUP VA ELEMENT, METHOD, COMPOSITION, DEVICE AND OTHER PRODUCTS

This application is a continuation of commonly owned PCT Application No. PCT/US2007/024320 filed 21 Nov. 2007, which was published in the English language as PCT Publication No. WO 2008/133660 on 6 Nov. 2008. The PCT Application claims priority to U.S. Application No. 60/866, 822 filed 21 Nov. 2006. The disclosures of each of the foregoing applications are hereby incorporated herein by reference in their entireties.

TECHNICAL FIELD OF THE INVENTION

The technical field of the present invention relates to nanocrystals, methods for preparing nanocrystals, and devices including nanocrystals.

SUMMARY OF THE INVENTION

In accordance with one aspect of the present invention, there is provided a nanocrystal comprising a semiconductor material comprising one or more elements of Group IIIA of the Periodic Table of Elements and one or more elements of Group VA of the Periodic Table of Elements, wherein the nanocrystal is capable of emitting light having a photoluminescence quantum efficiency of at least about 30% upon excitation.

In certain embodiments, the size of a nanocrystal can be, for example, from about 1 to about 20 nm. In certain embodiments, the size of a nanocrystal can be from about 1 to about 6 nm, from about 1 to about 5 nm, from about 1 to about 4 nm, from about 1 to about 3 nm, from about 1 to about 2 nm.

Advantageously, in certain embodiments efficient photoluminescence performance can be achieved without requiring nanocrystal etching, e.g., with a fluorine containing composition, e.g., HF.

In certain embodiments, the nanocrystal is capable of emitting light including a maximum peak emission at a wavelength in the range from about 500 nm to about 700 nm upon excitation. In certain embodiments, the maximum peak emission has a full width at half maximum (FWHM) of less than or equal to 70 nm, less than or equal to 60 nm, less than or equal to 50 nm, less than or equal to 40 nm, or less than or equal to 30 nm.

In certain embodiments, the nanocrystal is capable of emitting light including a maximum peak emission at a wavelength in the range from about 560 nm to about 650 nm upon excitation.

In certain embodiments, the nanocrystal can further include one or more ligands attached to the surface of the nanocrystal.

In accordance with another aspect of the present invention, there is provided a nanocrystal including a core comprising a first semiconductor material comprising one or more elements of Group IIIA of the Periodic Table of Elements and one or more elements of Group VA of the Periodic Table of Elements, and a shell disposed over at least a portion of the core, the shell comprising a second semiconductor material, wherein the nanocrystal is capable of emitting light having a photoluminescence quantum efficiency of at least about 30% upon excitation.

In certain embodiments, the nanocrystal is capable of emitting light including a maximum peak emission at a wavelength in the range from about 500 nm to about 700 nm upon excitation. In certain embodiments, the maximum peak emission has a full width at half maximum (FWHM) of not more than 70 nm, not more than 60 nm, not more than 50 nm, not more than 40 nm, or not more than 30 nm.

In certain embodiments, the nanocrystal is capable of emitting light including a maximum peak emission at a wavelength in the range from about 570 nm to about 650 nm upon excitation.

In certain embodiments, a core/shell nanocrystal can have an average diameter from, for example, about 3 to about 55 nm, from about 3 to about 40 nm, from about 3 to about 25 nm, from about 3 to about 10 nm. In certain embodiments, the average diameter of a nanocrystal core can be, for example, from about 1 to about 7 nm, from about 1 to about 4 nm, from about 2 to about 3 nm, from about 4 to about 7 nm. An example of an average thickness for a shell is from about 1 to about 3 nm, which corresponds to an approximately 10 monolayer thickness. (In such example, a monolayer thickness would be approximately from about 1 to about 3 Angstroms.) The actual monolayer thickness is dependent upon the size and composition of the molecules included in the shell.

In certain embodiments, the shell is disposed over, for example, at least 60%, at least 70%, at least 80%, at least 90% of a surface of the nanocrystal core. In certain preferred embodiment, the nanocrystal core is substantially completely (e.g., greater than 95%, greater than 96%, greater than 97%, greater than 98%, greater than 99%) overcoated with the shell.

In certain embodiments, the nanocrystal can include one or more ligands attached to the surface of the nanocrystal.

In certain embodiments, the nanocrystal core on which the shell is disposed is capable of emitting light having a photoluminescence quantum efficiency of at least about 3% upon excitation prior to disposition of a shell thereon.

In accordance with another aspect of the invention, there is provided a population of nanocrystals comprising a semiconductor material comprising one or more elements of Group IIIA of the Periodic Table of Elements and one or more elements of Group VA of the Periodic Table of Elements, wherein the population is capable of emitting light having a photoluminescence quantum efficiency of at least about 30% upon excitation, and wherein the light emitted by the population has a FWHM no greater than about 70 nm.

In accordance with another aspect of the present invention, there is provided a population of nanocrystals, wherein the nanocrystals comprise a core comprising a first semiconductor material comprising one or more elements of Group IIIA of the Periodic Table of Elements and one or more elements of Group VA of the Periodic Table of Elements, and a shell disposed over at least a portion of the core, the shell comprising a second semiconductor material, wherein the population is capable of emitting light having a photoluminescence quantum efficiency of at least about 30% upon excitation.

In accordance with another aspect of the present invention, there is provided a nanocrystal core comprising a semiconductor material comprising one or more elements of Group IIIA of the Periodic Table of Elements and one or more elements of Group VA of the Periodic Table of Elements, wherein the nanocrystal core is capable of emitting light having a photoluminescence quantum efficiency of at least about 3% upon excitation In certain embodiments, the average diameter of the nanocrystal core can be, for example, from about 1 to about 7 nm, from about 1 to about 4 nm, from about 2 to about 3 nm, from about 4 to about 7 nm.

In accordance with one aspect of the invention, there is provided a method for preparing a nanocrystal comprising a semiconductor material comprising one or more elements of Group IIIA of the Periodic Table of Elements and one or more elements of Group VA of the Periodic Table of Elements, the method comprising dispersing one or more Group IIIA precursors in a first solvent to form one or more Group IIIA reactants; dispersing one or more Group VA precursors in a second solvent to form one or more Group VA reactants; mixing the one or more Group IIIA reactants and the one or more Group VA reactants to form a reaction mixture, and adding an acid to the reaction mixture to promote reaction of the reactants to form nanocrystals of the semiconductor material. Optionally, an amine is also present in the reaction mixture prior to the addition of the acid.

Preferably the acid comprises a carboxylic acid. Examples of certain preferred embodiments include, but are not limited to, $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid), and mixtures of any two or more of the foregoing). Other non-limiting examples include 9-octadecenoic [oleic] acid. Other suitable acids can be readily ascertained by one of ordinary skill in the art. In certain embodiments, the acid can also act as a ligand source.

In certain more preferred embodiments, the acid is dispersed in a third solvent before being added to the reaction mixture.

Solvents, Group IIIA and Group VA precursors, and optional amines are discussed in more detail below.

In accordance with a further aspect of the present invention, there is provided a method for preparing a nanocrystal comprising a semiconductor material comprising one or more elements of Group IIIA of the Periodic Table of Elements and one or more elements of Group VA of the Periodic Table of Elements. The method comprises dispersing one or more Group IIIA precursors in a first solvent to form one or more Group IIIA reactants; dispersing one or more Group VA precursors in a second solvent to form one or more Group VA reactants; and reacting the one or more Group IIIA reactants with one or more Group VA reactants in the presence of a ligand source in a third solvent to form nanocrystals having one or more ligands attached to at least a portion of the nanocrystals.

In certain preferred embodiments of the methods of the present invention, the first solvent comprises a coordinating solvent, the second solvent comprises a non-coordinating solvent, and the third solvent comprises a non-coordinating solvent. In certain embodiments, the second and third solvents are preferably the same. Preferably, each of the solvents is a liquid at room temperature for convenience.

In certain embodiments, the first solvent can comprise a non-coordinating solvent. In certain embodiments, the first solvent can comprise a mixture of solvents. In certain preferred embodiments, the first solvent comprises a coordinating solvent. In certain preferred embodiments, the first solvent comprises methyl myristate, dioctyl ether or other high boiling point ether, diphenyl oxide, biphenyl, a mixture, more preferably a eutectic mixture, comprising biphenyl and diphenyl oxide, including, e.g., DOWTHERM A, available from the Dow Chemical Company.

In certain preferred embodiments of the methods of the present invention, the second solvent comprises a non-coordinating solvent. In certain embodiments, the second solvent comprises a mixture of solvents.

In certain preferred embodiments of the methods of the present invention, the third solvent comprises a non-coordinating solvent. In certain embodiments, the third solvent comprises a mixture of solvents.

In certain embodiments of the methods of the present invention, at least a portion of the one or more Group IIIA precursors dissolve in the first solvent to form one or more Group IIIA reactants and the at least a portion of the one or more Group VA precursors dissolve in the second solvent to form one or more Group VA reactants In certain embodiments, one or more Group IIIA reactants can be reacted with one or more Group VA reactants in the presence of a ligand source and an amine.

In certain embodiments, the method comprises dispersing one or more Group IIIA precursors in a first solvent to form one or more Group IIIA reactants; dispersing one or more Group VA precursors in a second solvent to form one or more Group VA reactants; adding one or more Group IIIA reactants and one or more Group VA reactants to a reaction medium including a third solvent and a ligand source to form a reaction mixture, and reacting the reaction mixture under conditions sufficient to form nanocrystals of the semiconductor material having a predetermined composition, predetermined size, and predetermined emission characteristics, at least a portion of the nanocrystals including one or more ligands attached thereto.

A description of first, second, and third solvents is provided above.

In certain embodiments, the reaction medium further includes an amine.

Examples of Group IIIA precursors include elements, covalent compounds, or ionic compounds, including coordination complexes or a metal salt, that serve as a source for the electropositive element or elements in the resulting nanocrystal. Examples of Group VA precursors include elements, covalent compounds, or ionic compounds that serve as a source for the electronegative element or elements in the resulting nanocrystal. In certain embodiments, binary materials, ternary materials, quaternary materials, and even more complex species may be prepared using the method, in which case more than one Group IIIA precursor and/or more than one Group VA precursor are included.

For example, a Group IIIA precursor can constitute a wide range of substances, such as a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, a metal salt, and the like. Non-limiting examples of indium precursors include $InMe_3$, In(III) acetate, In(III) trifluoroacetate, $InR_3$ (wherein R=ethyl, propyl, butyl, pentyl, hexyl, isopropyl, isobutyl, tert-butyl). Other suitable Group IIIA precursors can be readily ascertained by one of ordinary skill in the art.

Group VA precursors are most often selected from the element itself (oxidation state 0), covalent compounds, or ionic compounds of the group V elements (N, P, As, or Sb). Non-limiting examples of phosphorus precursors include $P(SiR_3)_3$ wherein R=methyl, ethyl, propyl, butyl, pentyl, hexyl, isopropyl, isobutyl, tert-butyl). Other suitable Group VA precursors can be readily ascertained by one of ordinary skill in the art.

In a typical preparation, the ligand is selected from fatty acids, amines, phosphines, phosphine oxides, or phosphonic acids.

Examples of a preferred ligand source include carboxylic acids. In certain preferred embodiments, the ligand source comprises $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid), and mixtures of any two or more of the foregoing). Other non-limiting examples include 9-octadecenoic [oleic] acid. Other suitable ligand sources can be readily ascertained by one of ordinary skill in the art.

Examples of amines include, but are not limited to, secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), etc.; and primary amines, e.g., $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine). Other suitable amines can be readily ascertained by one of ordinary skill in the art.

Examples of suitable coordinating solvents include, but are not limited to, octadecene, squalene, methyl myristate, octyl octanoate, hexyl octanoate, and $CH_3(CH_2)_nC(O)O(CH_2)_mCH_3$ wherein n=4-18 and m=1-8, dioctyl ether, and diphenyl ether, and mixtures of one or more solvents. A preferred mixture comprises a mixture, more preferably a eutectic mixture, of biphenyl and diphenyl oxide, including, e.g., DOWTHERM A, available from the Dow Chemical Company. Other high boiling point ethers (e.g., BP>~200° C.) may also be used. Such ethers (coordinating) can be aromatic ethers, aliphatic ethers or aromatic aliphatic ethers. Examples of additional ethers include, but are not limited to, dihexyl ether, diethyleneglycol dimethyl ether, diethyleneglycol dibutyl ether, triethyleneglycol dimethyl ether, tetraethyleneglycol dimethyl ether, butyl phenyl ether, benzyl phenyl ether, dibenzyl ether, ditolyl ether and isomers thereof. Mixtures of two or more solvents can also be used. Other suitable coordinating solvents can be readily ascertained by one of ordinary skill in the art.

Most preferably the coordinating first and/or second solvent included in the methods of the invention does not include alkyl phosphines, alkyl phosphine oxides, alkyl phosphonic acids, alkyl phosphinic acids, pyridine, tri-n-octyl phosphine (TOP), tri-n-octyl phosphine oxide (TOPO), trishydroxylpropylphosphine (tHPP), or other coordinating solvents that include a phosphorus or nitrogen atom.

Examples of suitable non-coordinating solvents include, but are not limited to, squalane, octadecane, or any other saturated hydrocarbon molecule. Mixtures of two or more solvents can also be used. Other suitable non-coordinating solvents can be readily ascertained by one of ordinary skill in the art. In certain embodiments, non-coordinating solvents comprise liquids having a dipole moment in the range form 0 to about 0.2 μ/D. In certain embodiments, coordinating solvents comprise liquids having a dipole moment from 0.7 to 4 μ/D (e.g., strongly coordinating) or liquids having a dipole moment in the range from 0.2 to 0.7 μ/D (e.g., weakly coordinating).

In certain embodiments, the reaction is carried out in an inert atmosphere. In certain embodiments, the reaction is carried out in a controlled atmosphere (substantially free of moisture and air).

In certain embodiments, the nanocrystal prepared is capable of emitting light having a photoluminescence quantum efficiency of at least about 30% upon excitation.

In certain embodiments, the method further includes forming a shell comprising one or more additional semiconductor materials over at least a portion of the surface of at least a portion of the nanocrystal. In certain preferred embodiments, the one or more additional semiconductor materials are different from the semiconductor material included in the nanocrystal.

In certain embodiments, the nanocrystal is isolated from the reaction mixture and purified before the shell is formed.

In certain embodiments, a nanocrystal including a shell further includes one or more ligands attached to the surface of the nanocrystal.

Shell thickness can be varied by growing a desired thickness of the shell. For example, the shell can have a thickness less than about one monolayer, about one monolayer, or more than about one monolayer. Preferably, the thickness is less than that at which quantum confinement is not achieved. The thickness is selected to achieve the predetermined characteristics of the core/shell nanocrystal. In certain embodiments, the thickness is in the range from greater than about 0 to about 20 monolayers. In certain embodiments, the thickness is in the range from greater than about 0 to about 10 monolayers. In certain embodiments, the thickness is in the range from greater than about 0 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown.

In a further aspect of the present invention there is provided a composition including a nanocrystal comprising a semiconductor material comprising one or more elements of Group IIIA of the Periodic Table of Elements and one or more elements of Group VA of the Periodic Table of Elements, wherein the nanocrystal is capable of emitting light having a photoluminescence quantum efficiency of at least about 30% upon excitation.

In certain embodiments, the nanocrystal includes a core comprising a first semiconductor material comprising one or more elements of Group IIIA of the Periodic Table of Elements and one or more elements of Group VA of the Periodic Table of Elements, and a shell disposed over at least a portion of the core, the shell comprising a second semiconductor material, wherein the nanocrystal is capable of emitting light having a photoluminescence quantum efficiency of at least about 30% upon excitation. Examples of first semiconductor materials and second semiconductor materials are described above and in the detailed description.

In certain embodiments, the luminescence includes a maximum peak emission with a full width at half maximum (FWHM) of not more than 70 nm, not more than 60 nm, not more than 50 nm, not more than 40 nm, or not more than 30.

In certain embodiments, the nanocrystal is capable of emitting light including a maximum peak emission at a wavelength in the range from about 500 nm to about 700 nm upon excitation. In certain embodiments, the maximum peak emission has a full width at half maximum (FWHM) of not more than 70 nm, not more than 60 nm, not more than 50 nm, not more than 40 nm, or not more than 30.

In certain embodiments, the nanocrystal is capable of emitting light including a maximum peak emission at a wavelength in the range from about 560 nm to about 650 nm upon excitation.

In certain embodiment, the composition further includes a polymer. In certain embodiments, the composition further includes a pre-polymer.

In certain embodiments, the composition further includes an oligomer.

In certain embodiments, the composition further includes a small molecule.

In certain embodiments, the composition further includes an inorganic material.

In certain embodiments, the composition comprises a matrix. The matrix can comprise an organic or inorganic material.

In certain embodiments, the semiconductor nanocrystals are dispersed in the matrix. In certain embodiments, the semiconductor nanocrystals are randomly dispersed in the matrix. In certain embodiments, the semiconductor nanocrystals are homogeneously dispersed in the matrix.

Non-limiting examples of matrices include, but are not limited to, a polymer (e.g., polystyrene, epoxy, polyimides), a glass (e.g., silica glass), a gel (e.g., a silica gel), and any other material which is at least partially, and preferably fully, transparent to the light emitted by the semiconductor nanocrystals and in which semiconductor nanocrystals can be included. Depending on the use of the composition, the matrix can be conductive or non-conductive. Examples of preferred matrices include, but are not limited to, glass or a resin. Resins can be non-curable resins, heat-curable resins, or photocurable resins. More specific examples of resins can be in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Examples of a photo-polymerizable resin include an acrylic acid or methacrylic acid based resin containing a reactive vinyl group, a photo-crosslinkable resin which generally contains a photo-sensitizer, such as polyvinyl cinnamate, or the like. A heat-curable resin may selected when the photo-sensitizer is not used. Matrix resins may be used individually or in combination of two or more. Other matrix materials can be readily identified by one of ordinary skill in the art. In certain embodiments, a composition including a matrix may further include scatterers (e.g., without limitation, metal or metal oxide particles, air bubbles, and glass and polymeric beads (solid or hollow), and/or other optional additives typically used in the desired end-use application for the composition.

In certain embodiments, the composition further includes a liquid medium. In certain embodiments, compositions in accordance with the present invention including a liquid medium comprise an ink. Examples of suitable liquids and other optional additives that may be included in an ink are described in International Application No. PCT/US2007/00873 of Seth Coe-Sullivan et al., for "Composition Including Material, Methods Of Depositing Material, Articles Including Same And Systems For Deposition Material", filed 9 Apr. 2007, and International Application No. PCT/US2007/014711 of Seth Coe-Sullivan et al., for "Methods For Depositing Nanomaterial, Methods For Fabricating A device, And Methods For Fabricating An Array Of Devices", filed 25 Jun. 2007, which are each hereby incorporated herein by reference in their entireties.

In certain embodiments, the composition further includes a non-polar liquid in which the semiconductor nanocrystal is dispersible.

In certain embodiments, the composition further includes a polar liquid in which the semiconductor nanocrystal is dispersible.

In accordance with a still further aspect of the present invention there is provided a device including a nanocrystal comprising a semiconductor material comprising one or more elements of Group IIIA of the Periodic Table of Elements and one or more elements of Group VA of the Periodic Table of Elements, wherein the nanocrystal is capable of emitting light having a photoluminescence quantum efficiency of at least about 30% upon excitation.

In certain embodiments, a nanocrystal includes a core comprising a first semiconductor material comprising one or more elements of Group IIIA of the Periodic Table of Elements and one or more elements of Group VA of the Periodic Table of Elements, and a shell disposed over at least a portion of the core, the shell comprising a second semiconductor material, wherein the nanocrystal is capable of emitting light having a photoluminescence quantum efficiency of at least about 30% upon excitation. Examples of first semiconductor materials and second semiconductor materials are described above and in the detailed description.

In certain embodiments, the luminescence includes a maximum peak emission with a full width at half maximum of not more than 70 nm, not more than 60 nm, not more than 50 nm, not more than 40 nm, or not more than 30 nm.

In certain embodiments, the nanocrystal is capable of emitting light including a maximum peak emission at a wavelength in the range from about 500 nm to about 700 nm upon excitation. In certain embodiments, the maximum peak emission has a full width at half maximum (FWHM) of not more than 70 nm, not more than 60 nm, not more than 50 nm, not more than 40 nm, or not more than 30.

In certain embodiments, the nanocrystal is capable of emitting light including a maximum peak emission at a wavelength in the range from about 560 nm to about 650 nm upon excitation.

In accordance with another aspect of the present invention, there is provided a device including a nanocrystal comprising a semiconductor material comprising one or more elements of Group IIIA of the Periodic Table of Elements and one or more elements of Group VA of the Periodic Table of Elements, wherein the device further includes less than 1,000 ppm Pb, less than 100 ppm Cd, and less than 1,000 ppm Hg.

In certain embodiments of devices in accordance with various aspects of the present invention, the device comprises a light emitting device which includes a first electrode a second electrode opposed to the first electrode, and a plurality of nanocrystals in accordance with the invention disposed between the first electrode and the second electrode. In certain embodiments, one of the electrodes can be supported by a substrate (which can be flexible or rigid).

In certain embodiments of devices in accordance with various aspects of the present invention, a light emitting device includes a first electrode a second electrode opposed to the first electrode, and a plurality of nanocrystals comprising a nanocrystal comprising one or more elements of Group IIIA of the Periodic Table of Elements and one or more elements of Group VA of the Periodic Table of Elements, and the device includes less than 1,000 ppm Pb, less than 100 ppm Cd, and less than 1,000 ppm Hg.

In certain embodiments of devices in accordance with various aspects of the present invention, the device can be capable of emitting light including a maximum peak emission in the red region of the spectrum upon excitation.

In certain other embodiments of devices in accordance with various aspects of the present invention, the device can comprise a display, a laser, a photoelectric device, a solar cell, and the like.

In accordance with yet another aspect of the present invention, there is provided a biomedical tag including a nanocrystal in accordance with the present invention.

In accordance with yet another aspect of the present invention, there is provided a catalyst including a nanocrystal in accordance with the present invention.

In accordance with yet a further aspect of the present invention there is provided a nanocrystal comprising a nanocrystal core and a shell comprising a semiconductor material disposed on at least a portion of the nanocrystal core, wherein the semiconductor material comprises at least three chemical elements and is obtainable by a process comprising adding a precursor for at least one of the chemical elements of the semiconductor material from a separate source to a nanocrystal core while simultaneously adding amounts of precursors for the other chemical elements of the semiconductor material. The amounts of precursors for the other chemical elements of the semiconductor material can be added as a mixture and/or separately (depending on the number of other precursors). The amounts of precursor for the other chemical elements of the semiconductor material can be also added simultaneously or sequentially.

In certain embodiments, semiconductor material comprises zinc, sulfur, and selenium.

In certain embodiments, the zinc precursor is added separately and selenium and sulfur precursors are added as a mixture.

In certain embodiments, the zinc precursor is added separately and selenium and sulfur precursors are concurrently added from separate sources (e.g., not as a mixture).

In certain preferred embodiments, the molar ratio of the zinc precursor:sulfur precursor:selenium precursor is about 2:1:1. Other ratios can also be used.

In certain embodiments, zinc precursor is added separately and selenium and sulfur precursors are added sequentially. In certain embodiments, the zinc precursor is added, followed by the selenium precursor, followed by the sulfur precursor.

In certain embodiments, the process is carried out at a temperature and for a period of time sufficient to form a shell comprising the desired semiconductor material at a desired thickness.

In certain embodiments, each of the precursors is added at a predetermined rate. The rate of addition for each precursor can be the same or different.

Preferably the process is carried out in a liquid medium. In certain embodiments, the liquid medium can comprise a coordinating and/or a non-coordinating solvent. Examples of suitable coordinating and non-coordinating solvents are described herein. A preferred liquid medium comprises squalane.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description, from the claims, and from practice of the invention disclosed herein.

DETAILED DESCRIPTION OF THE INVENTION

In accordance with one aspect of the present invention there is provided a nanocrystal comprising a semiconductor material. The semiconductor material comprises one or more elements of Group IIIA of the Periodic Table of Elements and one or more elements of Group VA of the Periodic Table of Elements, wherein the nanocrystal is capable of emitting light having a photoluminescence quantum efficiency of at least about 30% upon excitation. A nanocrystal comprising a semiconductor material may also be referred to herein as a semiconductor nanoparticle, semiconductor nanocrystal, or semiconductor quantum dot.

A semiconductor nanocrystal is capable of emitting light upon excitation. A semiconductor nanocrystal can be excited by irradiation with an excitation wavelength of light, by electrical excitation, or by other energy transfer.

Photoluminescence quantum efficiency (also referred to as quantum efficiency, quantum yield or solution quantum yield) represents the percent of absorbed photons that are reemitted as photons upon excitation by irradiation with an excitation wavelength of light.

A nanocrystal is a nanometer sized particle, e.g., in the size range of up to about 1000 nm. In certain embodiments, a nanocrystal can have a size in the range of up to about 100 nm. In certain embodiments, a nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain preferred embodiments, a nanocrystal can have a size less than 100 Å. In certain preferred embodiments, a nanocrystal has a size in a range from about 1 to about 6 nanometers and more particularly from about 1 to about 5 nanometers. The size of a nanocrystal can be determined, for example, by direct transmission electron microscope measurement. Other known techniques can also be used to determine nanocrystal size.

Nanocrystals can have various shapes. Examples of the shape of a nanocrystal include, but are not limited to, sphere, rod, disk, tetrapod, other shapes, and/or mixtures thereof.

For applications that utilize the luminescent properties of a nanocrystal, the nanocrystal size is selected such that the nanocrystal exhibits quantum confinement. Such applications include, but are not limited to, light-emitting devices, lasers, biomedical tags, photoelectric devices, solar cells, catalysts, and the like. Light-emitting devices including nanocrystals in accordance with the present invention may be incorporated into a wide variety of consumer products, including, but not limited to, flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control such devices, including passive matrix and active matrix.

In accordance with another aspect of the present invention, a nanocrystal includes a core comprising a first semiconductor material comprising one or more elements of Group IIIA of the Periodic Table of Elements (for example, B, Al, Ga, In, and Tl), and one or more elements of Group VA of the Periodic Table of Elements (for example, nitrogen, phosphorus, arsenic, antimony, and bismuth), and a shell disposed over at least a portion of the core, the shell comprising one or more additional semiconductor materials, wherein the nanocrystal is capable of emitting light having a photoluminescence quantum efficiency of at least about 30% upon excitation. In certain embodiments, a shell can comprise two or more layers of the same or different semiconductor materials. In certain embodiments, a layer can include a single semiconductor material or a mixture of two or more semiconductor materials with different compositions, particle sizes, and/or emission characteristics. A semiconductor material may comprise a compound, a doped compound, and/or an alloy. A nanocrystal core surrounded by a shell is also referred to as having a "core/shell" structure.

As discussed above, a semiconductor material that can be included in a shell includes a semiconductor material having a composition that is the same as or different from the composition of the core. When two or more semiconductor materials are included in the shell, the shell can comprise a mixture of the two or more semiconductor materials in a single layer. In certain embodiments, the two or more semiconductor materials can be included in the shell as separate layers. In certain other embodiments, the shell can include a layer comprising one or more semiconductor materials, and one or more additional layers, each of which comprise one or more semiconductor materials. A semiconductor material included in the shell can comprise an element, for example, a Group IVA element. A semiconductor material included in the shell can comprise a compound represented by the formula MX. In certain examples M comprises, for example, one or more elements from Group IA element (for example, lithium, sodium, rubidium, and cesium), Group IIA (for example, beryllium, magnesium, calcium, strontium, and barium), Group IIB (for example, Zn, Cd, and Hg), Group IIIA (for example, Al, Ga, In and Tl), Group IVA (for example, Si, Ge, Sn, and Pb), and/or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, X comprises one or more elements from Group VA (for example, nitrogen, phosphorus, arsenic, antimony, and bismuth) and/or Group VIA (for example, oxygen, sulfur, selenium, and tellurium). In certain embodiments, a semiconductor material included in the shell comprises a binary (including two elements) material, a ternary (including three elements) material, a quaternary (including four elements) material, etc. In certain embodiments, the material can comprise an alloy and/or a mixture.

Non-limiting examples of a binary semiconductor material that can be included in the shell include ZnS, ZnSe, ZnTe, CdS, CdSe, CdTe, HgS, HgSe, HgTe (IIB-VIA materials), PbS, PbSe, PbTe (IVA-VIA materials), AlN, AlP, AlAs, AlSb, GaN, GaP, GaAs, GaSb, InN, InP, InAs, InSb (IIIA-VA materials). Non-limiting examples of ternary semiconductor materials that can be included in the shell include $A_xB_yC$ wherein A may comprise a Group IIB, IIIA or IVA element, B may comprise a group IIB, IIIA, or IVA element, and C may comprise a group VA or VIA element, and x and y are molar fractions between 0 and 1. Preferably $x+y=1$.

In certain embodiments, the shell can be formed over at least a portion of the core after the core is formed and purified. In certain embodiments, the shell can be formed over at least a portion of the core with prior purification of the core. In certain embodiments of the latter case, the formation of the shell can be carried out in the same reaction vessel in which the core is formed.

In certain embodiments, the shell can include semiconductor material(s) having a band gap greater than the band gap of the core material. In certain other embodiments, the shell can include semiconductor material(s) having a band gap less than the band gap of the core material.

In certain embodiments, the shell can be chosen so as to have an atomic spacing close to that of the "core" substrate. In certain other embodiments, the shell and core materials can have the same crystal structure.

In certain embodiments, the shell is between about 0.1 nm and 10 nm thick. The selection of the semiconductor material included in the shell may provide for a type I or a type II heterostructure.

Examples of preferred semiconductor materials for inclusion in the shell include, without limitation, ZnSe and/or ZnS. A more preferred semiconductor material for inclusion in the shell includes $ZnSe_xS_{1-x}$ (wherein 0<x<1); most preferably x is approximately 0.5.

Preparation and manipulation of nanocrystals comprising a semiconductor material are described, for example, in U.S. Pat. Nos. 6,322,901 and 6,576,291, and U.S. Patent Application No. 60/550,314, each of which is hereby incorporated herein by reference in its entirety. One method of manufacturing a nanocrystal, a nanocrystal core, and/or a nanocrystal shell is a colloidal growth process. Colloidal growth occurs by injection an M donor and an X donor into a hot coordinating or non-coordinating solvent. One example of a method for preparing monodisperse nanocrystals comprises pyrolysis of organometallic reagents injected into a hot, coordinating solvent. This permits discrete nucleation and results in the controlled growth of macroscopic quantities of nanocrystals. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of nanocrystals comprising semiconductor material can be carried out in the presence of an amine. See, for example, U.S. Pat. No. 6,576,291 for "Preparation of Nanocrystallites" of Bawendi et al. issued 10 Jun. 2003, which is hereby incorporated herein by reference in its entirety.

A narrow size distribution of the nanocrystals comprising semiconductor material allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing documents are hereby incorporated herein by reference in their entireties.

The process of controlled growth and annealing of nanocrystals in a solvent that follows nucleation can also result in uniform surface derivatization and regular structures. As the size distribution sharpens, the temperature can be raised to maintain steady growth. By adding more M donor or X donor, the growth period can be shortened. The M donor can be an inorganic compound, an organometallic compound, or elemental metal. For example, in preparing a semiconductor material comprising one or more Group IIIA elements of the Period Table of Elements, M comprises one or more of boron, aluminum, gallium, indium, and thallium. Additional chemical elements can optionally be further included. In preparing other semiconductor materials, e.g., in preparing a shell, M is selected based on the composition of the desired semiconductor material. The X donor is a compound capable of reacting with the M donor to form a material with the general formula MX. For example, in preparing a semiconductor material comprising a Group VA element of the Period Table of Elements, X comprises one or more of nitrogen, phosphorus, arsenic, antimony, or bismuth. In preparing other semiconductor materials, X is selected based on the composition of the desired semiconductor material. For example, X donor can be a chalcogenide (Group VIA) donor or a pnictide (Group VA) donor, such as a phosphine chalcogenide, a bis(silyl) chalcogenide, dioxygen, an ammonium salt, or a tris(silyl) pnictide. Examples of suitable X donors include, but are not limited to, dioxygen, bis(trimethylsilyl) selenide ((TMS)$_2$Se), octadecene-Se, trialkyl phosphine selenides such as (tri-n-octylphosphine) selenide (TOPSe) or (tri-n-butylphosphine) selenide (TBPSe), octadecene-Te, trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), octadecene-S, bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule. For example, in preparing ZnSe, M comprises zinc and X comprises selenium.

A solvent can help control the growth of a nanocrystal comprising semiconductor material. In preparing a shell, a coordinating solvent can be used. A coordinating solvent is a compound having at least one donor site (e.g., a lone electron pair) that, for example, is available to coordinate to a surface of the growing nanocrystal. Solvent coordination can stabilize the growing nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. More specific examples of suitable coordinating solvents include pyridine, tri-n-octyl phosphine (TOP), tri-n-octyl phosphine oxide (TOPO) and trishydroxylpropylphosphine (tHPP). Technical grade TOPO can be used. Alternatively, a non-coordinating solvent could be used. Examples of non-coordinating solvents include saturated hydrocarbons; other examples are provided elsewhere herein.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, by stopping growth at a particular semiconductor nanocrystal average diameter, a population having an average semiconductor nanocrystal diameter of less than 150 Å can be obtained. A population of nanocrystals can have an average diameter of 15 Å to 125 Å. In addition, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the nanocrystals can be further refined by size selective precipitation with a poor solvent for the nanocrystals, such as, for example, methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population preferably has no more than a 15% rms deviation from mean diameter, more preferably 10% rms deviation or less, and most preferably 5% rms deviation or less.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

As discussed herein, nanocrystals preferably have ligands attached thereto.

In preparing a shell, ligands can, for example, be derived from the solvent used during the growth process. The surface can be modified by repeated exposure to an excess of a competing coordinating group to form an overlayer. For example, a dispersion of the capped nanocrystal can be treated with a coordinating organic compound, such as pyridine, to produce nanocrystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a liquid medium in which the nanocrystal is suspended or dispersed. Such affinity improves the stability of the suspension and discourages flocculation of the nanocrystal.

Organic ligands can be useful in facilitating large area, non-epitaxial deposition of highly stable inorganic nanocrystals within a device.

In certain embodiments, a coordinating ligand can have the formula:

$$(Y{-})_{k-n}{-}(X){-}({-}L)_n$$

wherein k is 2, 3 4, or 5, and n is 1, 2, 3, 4 or 5 such that k-n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Monodentate alkyl phosphines (and phosphine oxides, the term phosphine in the following discussion of ligands will refer to both) can passivate nanocrystals efficiently. When nanocrystals with conventional monodentate ligands are diluted or embedded in a non-passivating environment (i.e. one where no excess ligands are present), they can lose their high luminescence and their initial chemical inertness. Typical are an abrupt decay of luminescence, aggregation, and/or phase separation. In order to overcome these possible limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, trishydroxypropylphosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

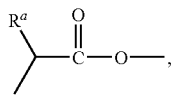

R' has the formula

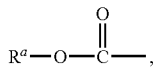

wherein $R^a$ is hydrogen or $C_1$-$C_4$ alkyl, or R' is hydrogen.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

In accordance with one aspect of the invention, there is provided a method for preparing a nanocrystal comprising a semiconductor material comprising one or more elements of Group IIIA of the Periodic Table of Elements and one or more elements of Group VA of the Periodic Table of Elements, the method comprising dispersing one or more Group IIIA precursors in a first solvent to form one or more Group IIIA reactants; dispersing one or more Group VA precursors in a second solvent to form one or more Group VA reactants; mixing the one or more Group IIIA reactants and the one or more Group VA reactants to form a reaction mixture, and adding an acid to the reaction mixture to promote reaction of the reactants to form nanocrystals of the semiconductor material. Optionally, an amine is also present in the reaction mixture prior to the addition of the acid. Preferably the acid is dispersed or dissolved in a third solvent prior to addition. In certain preferred embodiments, the second and third solvents comprises squalane, octadecane, or another non-coordinating solvent; and the first solvent comprises methyl myristate, an ether (e.g., dioctyl ether or other high boiling point ethers (see above)), biphenyl, diphenyl oxide, mixtures of two or more coordinating solvents (e.g., a mixture, more preferably a eutectic mixture of biphenyl and diphenyl oxide (such as, e.g., Dowtherm A)).

In certain preferred embodiments, the ratio of the molar amount of Group IIIA precursors to the molar amount of Group VA precursors included in the reaction mixture at the initiation of the reaction is greater than one. In certain more preferred embodiments this molar ratio is about 2. In certain embodiments, additional Group IIIA and/or Group VA precursors can be added after nucleation of the nanocrystals.

In certain preferred embodiments, the ratio of the molar amount of H+ to the molar amount of amine groups included in the reaction mixture at the initiation of the reaction is greater than one. In certain more preferred embodiments this molar ratio is about 2.5.

In certain preferred embodiments, the reaction is carried out at an injection temperature less than 280 C. Preferably, the reaction injection temperature is in a range from about 175 C to about 260 C, more preferably in a range from about 220 C to about 260 C.

In certain preferred embodiments, the reaction is carried out at a growth temperature less than 250 C. Preferable, the reaction growth temperature is in a range from about 170 C to about 225 C, more preferably in a range from about 175 C to about 205 C.

In certain embodiments, the concentration of Group IIIA precursor in the injection solution is in a range from about 0.1M to 0.5M, preferable in a range of about 0.2M to 0.3M, and more preferably about 0.25M.

In certain embodiments, the concentration of Group VA precursor in the injection solution is in a range from about 0.05M to 0.25M, preferable in a range of about 0.1M to 0.15M, and more preferably about 0.125M.

In certain embodiments, the concentration of Group IIIA precursor in the total reaction volume is in a range of about 0.02M to 0.1M, preferable in a range of about 0.04M to 0.06M, and more preferably about 0.05M.

In certain embodiments, the concentration of Group VA precursor in the total reaction volume is in a range of about 0.01M to 0.05M, preferable in a range of about 0.02M to 0.03M, and more preferably about 0.025M.

In certain embodiments, the concentration of the acid in the total reaction volume is in a range of about 0.05M to 0.2M, and more preferably about 0.125M to 0.175M.

In certain embodiments, the concentration of the amine in the total reaction volume is in a range of about 0.015M to 0.125M, and more preferably about 0.045M to 0.075M. Preferably the acid comprises a carboxylic acid. Examples of certain preferred embodiments include, but are not limited to, $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic

[arachidic] acid), and mixtures of any two or more of the foregoing). Other non-limiting examples include 9-octadecenoic [oleic] acid. Other suitable acids can be readily ascertained by one of ordinary skill in the art. In certain embodiments, the acid can also act as a ligand source.

In accordance with one aspect of the present invention, a nanocrystal comprising a semiconductor material comprising one or more elements of Group IIIA of the Periodic Table of Elements and one or more elements of Group VA of the Periodic Table of Elements is prepared by a method comprising dispersing or dissolving one or more Group IIIA precursors in a first solvent to form one or more Group IIIA reactants; dispersing or dissolving one or more Group VA precursors in a second solvent to form one or more Group VA reactants; and reacting one or more Group IIIA reactants with one or more Group VA reactants in a reaction medium including a ligand source to form nanocrystals of the semiconductor material having one or more ligands attached to at least a portion of the nanocrystals.

In one embodiment, the method comprises dispersing or dissolving one or more Group IIIA precursors in a first solvent to form one or more Group IIIA reactants; dispersing or dissolving one or more Group VA precursors in a second solvent to form one or more Group VA reactants; adding one or more Group IIIA reactants and one or more Group VA reactants to a reaction medium including a third solvent and a ligand source to form a reaction mixture, and reacting the reaction mixture under conditions sufficient to form nanocrystals of the semiconductor material having a predetermined composition, predetermined size, and predetermined emission characteristics, at least a portion of the nanocrystals including one or more ligands attached thereto.

In the various methods of the invention, the relative amounts of the one or more Group IIIA reactants and the one or more Group VA that are reacted are selected based upon the predetermined composition, predetermined size, and predetermined emission characteristics of the desired nanocrystal.

Examples of Group IIIA precursors useful in the methods of the invention include elements, covalent compounds, or ionic compounds, including coordination complexes or a metal salt, that serve as a source for the electropositive element or elements in the resulting nanocrystal. Examples of Group VA precursors include elements, covalent compounds, or ionic compounds that serve as a source for the electronegative element or elements in the resulting nanocrystal. In certain embodiments, binary materials, ternary materials, quaternary materials, and even more complex species may be prepared using the method, in which case more than one Group IIIA precursor and/or more than one Group VA precursor are included.

For example, a Group IIIA precursor can constitute a wide range of substances, such as a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, a metal salt, and the like. In a typical preparation, the ligand is selected from fatty acids, amines, phosphines, phosphine oxides, or phosphonic acids. Non-limiting examples of indium precursors include $InMe_3$, In(III) acetate, In(III) trifluoroacetate, $InR_3$ (wherein R=ethyl, propyl, butyl, pentyl, hexyl, isopropyl, isobutyl, tert-butyl).

Group VA precursors useful in the methods of invention are most often selected from the element itself (oxidation state 0), covalent compounds, or ionic compounds of the group V elements (N, P, As, or Sb). Non-limiting examples of phosphorus precursors include $P(SiR_3)_3$ wherein R=methyl, ethyl, propyl, butyl, pentyl, hexyl, isopropyl, isobutyl, tert-butyl.

In a typical preparation including a ligand source, the ligand is selected from fatty acids, amines, phosphines, phosphine oxides, or phosphonic acids.

In certain embodiments, the ligand source preferably comprises carboxylic acids. In certain preferred embodiments, the ligand comprises $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid). As between myristic acid and stearic acid, myristic acid is preferred. Oleic acid is another example of a preferred acid.

In certain embodiments of method of the invention, the reaction medium or reaction mixture further includes an amine. Examples of amines include, but are not limited to, secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), etc.; and primary amines, e.g., $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine). Examples of preferred amines include octadecylamine and oleylamine. Other suitable amines can be readily ascertained by one of ordinary skill in the art.

In certain embodiments, the reaction is carried out in an inert atmosphere, where exposure to air is substantially, and preferably completely, precluded.

Examples of suitable coordinating solvents include, but are not limited to, octadecene, squalene, methyl myristate, octyl octanoate, hexyl octanoate, and $CH_3(CH_2)_nC(O)O(CH_2)_mCH_3$ wherein n=4-18 and m=1-8, dioctyl ether, and diphenyl ether, and mixtures of one or more solvents. A preferred mixture comprises a mixture, more preferably a eutectic mixture, of biphenyl and diphenyl oxide, including, e.g., DOWTHERM A, available from the Dow Chemical Company. Other high boiling point ethers (e.g., BP>~200° C.) may also be used. Such ethers (coordinating) can be aromatic ethers, aliphatic ethers or aromatic aliphatic ethers. Examples of additional ethers include, but are not limited to, dihexyl ether, diethyleneglycol dimethyl ether, diethyleneglycol dibutyl ether, triethyleneglycol dimethyl ether, tetraethyleneglycol dimethyl ether, butyl phenyl ether, benzyl phenyl ether, dibenzyl ether, ditolyl ether and isomers thereof. Mixtures of two or more solvents can also be used. Other suitable coordinating solvents can be readily ascertained by one of ordinary skill in the art.

Examples of suitable non-coordinating solvents include, but are not limited to, squalane, octadecane, or any other saturated hydrocarbon molecule. Mixtures of two or more solvents can also be used. Other suitable non-coordinating solvents can be readily ascertained by one of ordinary skill in the art. In certain embodiments, non-coordinating solvents comprise liquids having a dipole moment in the range form 0 to about 0.2 μ/D. In certain embodiments, coordinating solvents comprise liquids having a dipole moment from 0.7 to 4 μ/D (e.g., strongly coordinating) or liquids having a dipole moment in the range from 0.2 to 0.7 μ/D (e.g., weakly coordinating).

In embodiments of methods of the invention including an acid or acid ligand source, at higher acid concentrations in the reaction medium or reaction mixture, a larger size distribution may result.

In certain embodiments of methods of the invention that include an acid or acid ligand source and amine in the reaction medium or reaction mixture, increasing the ratio of acid concentration to amine concentration can provide a nanocrystal capable of emission at higher emission wavelengths and, with 175° C. mixing temperatures, lower FWHM at such higher emission wavelengths.

In certain embodiments, the methods of the invention further include forming a shell comprising one or more additional semiconductor materials over at least a portion of the surface of at least a portion of the nanocrystal. In certain preferred embodiments, the one or more additional semiconductor materials are different from the semiconductor material included in the nanocrystal. Examples of preferred semiconductor materials for inclusion in the shell include, without limitation, ZnSe and/or ZnS. A more preferred semiconductor material for inclusion in the shell includes $ZnSe_xSi_{1-x}$ (wherein 0<x<1); most preferably x is approximately 0.5. Preferred shell precursor materials include, without limitation, organometallic zinc compounds (e.g., diethyl zinc), bis-(trialkylsilyl) sulfides, and trialkylphosphine selenides. Other precursors can be readily ascertained by one of ordinary skill in the relevant art.

Preferably the shell is formed at a temperature in a range from about 180° C. to about 275° C., more preferably from about 200° C. to about 225° C.

When the addition of shell precursors is complete, the overcoated nanocrystals are preferably annealed prior to crash-out (e.g., precipitation from the reaction mixture) e.g., at a temperature in a range from about 100 C to about 180 C, and more preferably at about 150° C., for at least one hour, and preferably about 12-18 hours. More preferably, the annealing is carried out under $N_2$ atmosphere.

In certain embodiments, the nanocrystal is isolated from the reaction mixture and purified before the shell is formed.

In certain embodiments, a nanocrystal including a shell further includes one or more ligands attached to the surface of the nanocrystal.

EXAMPLES

The examples provided herein are provided as examples and not limitations, wherein a number of modifications of the exemplified compositions and processes are contemplated and within the scope of the present invention.

Example 1

InP Nanocrystal Preparation

| Compound | CAS # | FW (g/mol) | Moles (mmol) | Equiv. | Amt Used |
|---|---|---|---|---|---|
| myristic acid | 544-63-8 | 228.37 | 2.25 | 3.00 | 514 mg |
| dioctylamine | 1120-48-5 | 241.46 | 0.882 | 1.18 | 213 mg |
| trimethyl-indium | 3385-78-2 | 159.93 | 0.750 | 1.00 | 120 mg |
| tris-tri-methylsilyl-phosphine | 15573-38-3 | 250.54 | 0.38 | 0.50 | 94 mg |

-continued

| Compound | CAS # | FW (g/mol) | Moles (mmol) | Equiv. | Amt Used |
|---|---|---|---|---|---|
| methyl myristate | 124-10-7 | 242.41 | | | 10 + 4 + 4 mL |

Trimethylindium ($InMe_3$) (Strem Chemicals) is used without further purification. Methyl myristate and dioctylamine (Aldrich) are distilled under vacuum prior to use. tris-Trimethylsilylphosphine ($P(SiMe_3)_3$) (Acros or Strem) is distilled under vacuum prior to use. Myristic acid (Aldrich) is used without further purification. n-Hexane, methanol and n-butanol (anhydrous grade) (Aldrich) are used without further purification. Standard glove box and Schlenk techniques are used unless otherwise noted.

In the glove box, myristic acid and dioctylamine are suspended in 10.0 mL of methyl myristate and loaded into a 20 mL septum capped vial equipped with a stirbar. The vial is removed from the box and heated at 70° C. under $N_2$ until all the solids are dissolved forming the ligand solution. The ligand solution is added by syringe into a preheated, evacuated 4-neck, 50 mL round bottom flask. (The setup includes a 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for 45-60 minutes and then placed under an $N_2$ atmosphere and heated to the injection temperature of 260-270° C.

$InMe_3$ and $P(SiMe_3)_3$ are weighed out into separate vials in the glove box and each is separately dissolved in 4.0 mL of methyl myristate. Each precursor solution is loaded into a plastic syringe and removed from the glove box. Each precursor syringe is equipped with a 16 gauge, stainless steel needle and solutions are rapidly and simultaneously added by syringe into the heated pot including the reaction medium. The temperature drops to ~185° C. upon injection and is stabilized to 200-210° C. by the temperature controller for growth. Upon injection, reaction mixture changes from a colorless solution to a deep red color.

After 5 min at 200-210° C., the reaction mixture is rapidly cooled (<1 min) to room temperature with an ice bath. Quality of material is ascertained by UV-Vis and Photoluminescence (PL) spectroscopy. Typical PL values of the material in n-hexane give an emission peak at 585-600 nm with a full-width half-maximum (FWHM) of 58-63 nm.

The reaction mixture (including crude InP formed in the presence of the ligand source (myristic acid)) is then added by syringe into an evacuated, septum capped vial for transport into the glove box. The reaction mixture including crude InP is diluted with 5 mL n-hexane and 1 mL n-butanol. Methanol is slowly added to the mixture until the reaction becomes slightly turbid (typically 3-5 mL). The reaction mixture is centrifuged (4000 rpm, 5 min) and the InP nanocrystals are isolated by decanting the growth solution. InP is dissolved in ~3 mL n-hexane (forming a deep red solution) and filtered through a 0.2 μm syringe filter. 100-fold dilutions of the isolated nanocrystals give typical PL spectra with emission=600-610 nm and FWHM=48-52 nm and UV-Vis with an optical density @350 nm≈0.25. Higher optical densities (greater yields) can be obtained by adding more methanol than described, giving a harder crash-out (e.g., non-size selective precipitation) and a broader size distribution.

Example 2

InP Nanocrystal Preparation

| Compound | CAS # | FW (g/mol) | Moles (mmol) | Equiv. | Amt Used |
|---|---|---|---|---|---|
| myristic acid | 544-63-8 | 228.37 | 2.25 | 3.00 | 514 mg |
| dioctylamine | 1120-48-5 | 241.46 | 0.890 | 1.19 | 215 mg |
| trimethylindium | 3385-78-2 | 159.93 | 0.750 | 1.00 | 120 mg |
| tris-trimethyl-silylphosphine | 15573-38-3 | 250.54 | 0.38 | 0.50 | 94 mg |
| squalane | 111-01-3 | 422.81 | | | 9 + 3 mL |
| methyl myristate | 124-10-7 | 242.41 | | | 3 mL |

$InMe_3$ (Strem Chemicals) is used without further purification. Methyl myristate and dioctylamine (Aldrich) are distilled under vacuum prior to use. $P(SiMe_3)_3$ (Acros or Strem) is distilled under vacuum prior to use. Squalane (Aldrich) is degassed in vacuo at 150° C. for 8 h prior to use. Myristic acid (Aldrich) is used without further purification. n-Hexane, methanol and n-butanol (anhydrous grade) (Aldrich) are used without further purification. Standard glove box and Schlenk techniques are used unless otherwise noted.

In the glove box, myristic acid and dioctylamine are suspended in 9.0 mL of squalane and loaded into a 20 mL septum capped vial equipped with a stirbar. The vial is removed from the box and heated at 70° C. under $N_2$ until all the solids are dissolved to form a ligand solution. The ligand solution is added by syringe into a preheated, evacuated 4-neck, 50 mL round bottom flask. (The setup includes a 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for approximately 60 minutes and then placed under an $N_2$ atmosphere and heated to the injection temperature of 260° C.

$InMe_3$ is weighed out in the glove box and dissolved in 3.0 mL methyl myristate forming the indium precursor solution. $P(SiMe_3)_3$ is weighed out in the glove box and dissolved in 3.0 mL squalane forming the phosphorus precursor. Each precursor solution is loaded into a plastic syringe and removed from the glove box. Each precursor syringe is equipped with a 16 gauge, stainless steel needle and solutions are rapidly and simultaneously added by syringe into the heated pot including the reaction medium. The temperature drops to ~210° C. upon injection and is stabilized to 202-208° C. by the temperature controller for growth. Upon injection, reaction mixture changes from a colorless solution to a deep red color.

Aliquots of the reaction mixture are removed and analyzed at regular intervals using UV-Vis and PL spectroscopy to monitor reaction progress. After 10-15 min at 202-208° C., reaction mixture is rapidly cooled (<1 min) to room temperature with an ice bath. Quality of material is ascertained by UV-Vis and Photoluminescence (PL) spectroscopy. Typical PL values of the material in n-hexane give an emission peak at 565-585 nm with a full-width half-maximum (FWHM) of 48-58 nm.

The reaction mixture (including crude InP formed in the presence of the ligand source (myristic acid)) is then added by syringe into an evacuated, septum capped vial for transport into the glove box. The reaction mixture including crude InP is diluted with 5 mL n-hexane and 1 mL n-butanol. Acetone is slowly added to the mixture until the reaction becomes slightly turbid (typically 10-15 mL). The reaction mixture is centrifuged (4000 rpm, 5 min) and the InP nanocrystals are isolated by decanting the growth solution. InP is dissolved in ~3 mL n-hexane (forming a deep red solution) and filtered through a 0.2 μm syringe filter. 100-fold dilutions of the isolated nanocrystals give typical PL spectra with emission=575-595 and FWHM=41-48 nm and UV-Vis with an optical density @350 nm≈0.25. Higher optical densities (greater yields) can be obtained by adding more methanol than described, giving a harder crash-out and a broader size distribution.

Example 3

InP Nanocrystal Preparation

| Compound | CAS # | FW (g/mol) | Moles (mmol) | Equiv. | Amt Used |
|---|---|---|---|---|---|
| myristic acid | 544-63-8 | 228.37 | 2.25 | 3.00 | 514 mg |
| dioctylamine | 1120-48-5 | 241.46 | 0.890 | 1.19 | 215 mg |
| trimethylindium | 3385-78-2 | 159.93 | 0.750 | 1.00 | 120 mg |
| tris-trimethyl-silylphosphine | 15573-38-3 | 250.54 | 0.38 | 0.50 | 94 mg |
| squalane | 111-01-3 | 422.81 | | | 9 + 3 mL |
| octyl ether | 629-82-3 | 242.44 | | | 3 mL |

$InMe_3$ (Strem Chemicals) is used without further purification. Octyl ether and dioctylamine (Aldrich) are distilled under vacuum prior to use. $P(SiMe_3)_3$ (Acros or Strem) is distilled under vacuum prior to use. Squalane (Aldrich) is degassed in vacuo at 150° C. for 8 h prior to use. Myristic acid (Aldrich) is used without further purification. n-Hexane, methanol and n-butanol (anhydrous grade) (Aldrich) are used without further purification. Standard glove box and Schlenk techniques are used unless otherwise noted.

In the glove box, myristic acid and dioctylamine are suspended in 9.0 mL of squalane and loaded into a 20 mL septum capped vial equipped with a stirbar. The vial is removed from the box and heated at 70° C. under $N_2$ until all the solids are dissolved to form a ligand solution. The ligand solution is added by syringe into a preheated, evacuated 4-neck, 50 mL round bottom flask. (The setup includes a 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for approximately 60 minutes and then placed under an $N_2$ atmosphere and heated to the injection temperature of 240° C.

$InMe_3$ is weighed out in the glove box and dissolved in 3.0 mL octyl ether forming the indium precursor solution. $P(SiMe_3)_3$ is weighed out in the glove box and dissolved in 3.0 mL squalane forming the phosphorus precursor. Each precursor solution is loaded into a plastic syringe and removed from the glove box. Each precursor syringe is equipped with a 16 gauge, stainless steel needle and solutions are rapidly and simultaneously added by syringe into the heated pot including the reaction medium. The temperature drops to ~190° C. upon injection and is stabilized to 177-183° C. by the temperature controller for growth. Upon injection, reaction mixture changes from a colorless solution to a deep red color.

Aliquots of the reaction mixture are removed and analyzed at regular intervals using UV-Vis and photoluminescence spectroscopy to monitor reaction progress. After approximately 40 min at 177-183° C., reaction mixture is rapidly cooled (<1 min) to room temperature with an ice bath. Quality of material is ascertained by UV-Vis and Photoluminescence (PL) spectroscopy. Typical PL values of the material in n-hexane give an emission peak at 565-585 nm with a full-width half-maximum (FWHM) of 48-55 nm.

The reaction mixture (including crude InP formed in the presence of the ligand source (myristic acid)) is then added by syringe into an evacuated, septum capped vial for transport into the glove box. The reaction mixture including crude InP is diluted with 5 mL n-hexane and 1 mL n-butanol. Acetone is slowly added to the mixture until the reaction becomes slightly turbid (typically 10-15 mL). The reaction mixture is centrifuged (4000 rpm, 5 min) and the InP nanocrystals are isolated by decanting the growth solution. InP is dissolved in ~3 mL n-hexane (forming a deep red solution) and filtered through a 0.2 µm syringe filter. 100-fold dilutions of the isolated nanocrystals give typical PL spectra with emission=575-595 and FWHM=41-48 nm and UV-Vis with an optical density @350 nm≈0.25. Higher optical densities (greater yields) can be obtained by adding more methanol than described, giving a harder crash-out and a broader size distribution.

Example 4

Overcoating InP Nanocrystals with ZnSe

| Compound | CAS # | FW (g/mol) | Moles (mmol)* | Amt Used* |
|---|---|---|---|---|
| Diethylzinc | 557-20-0 | 123.51 | 1.16 | 143 mg |
| Trioctylphosphine selenide | 20612-73-1 | 449.60 (1M in TOP) | 1.16 | 1.16 mL |
| Oleylamine | 112-90-3 | 267.49 | 6.08 | 2.0 mL |
| 1-octadecene (ODE) | 112-88-9 | 252.48 | | 5.0 mL |
| methyl myristate | 124-10-7 | 242.41 | | 5.0 mL |

*amounts vary depending on optical density of InP core solution used $ZnEt_2$ (Strem Chemicals) is filtered through a 0.2 µm syringe filter prior to use. Methyl myristate (Aldrich) is distilled under vacuum prior to use. 1-Octadecene (ODE) (Aldrich) is degassed at 150° C. under vacuum for several hours prior to use. n-Hexane, methanol and n-butanol (anhydrous grade) (Aldrich) are used without further purification. Oleylamine (Pfalz and Bauer) is distilled under vacuum prior to use. Trioctylphosphine selenide (TOP-Se) is synthesized by dissolving the appropriate amount of selenium shot into trioctylphosphine (TOP). Selenium and TOP (Strem) are used without further purification. Standard glove box and Schlenk techniques are used unless otherwise noted.

Methyl myristate and ODE are added by syringe into a preheated, evacuated 4-neck, 50 mL round bottom flask. (The setup included 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for 60 minutes and is then placed under an $N_2$ atmosphere.

Typical preparations involve using a 3.0 mL n-hexane solution of InP nanocrystals (where the 100-fold dilution has an optical density of 0.5 @350 nm).

The InP solution is prepared in the glove box and added by syringe into the pot containing the degassed solvent. n-Hexane is removed in vacuo (~30 minutes) and the flask is placed back under $N_2$ and heated to 200° C. TOP-Se and diethylzinc are measured out into separate vials in the glove box and are dissolved in ODE and diluted such that each has a total volume of 4.0 mL. The solutions are loaded into two 5 mL syringes and removed from the glove box. Se and Zn solutions are added slowly to the pot using a syringe pump and capillary tubing. Upon starting the syringe pump, 2.0 mL of oleylamine is rapidly injected into the flask containing the InP solution. Typical addition time of the zinc and selenium reagents is 2 h using an addition rate of 33 µL/min (2 mL/h). After Zn and Se precursor addition is completed, reaction mixture is allowed to slowly cool to ca. 70° C. over a course of 30 min.

The reaction is then added by syringe into an evacuated, septum capped vial for transport into the glove box. Upon cooling, a flocculent, white solid precipitates out of the red reaction mixture. The reaction mixture is reheated to ca. 70° C. to redissolve the white solid, forming a red, homogenous solution. The mixture is diluted with 10 mL n-hexane and centrifuged (4000 rpm for 5 min). The red supernatant is decanted and collected and the white solids are washed with n-hexane (~10 mL) and centrifuged again. The supernatant is decanted off and added to the first fraction. ~5 mL of n-butanol is added to the red nanocrystal solution followed by enough methanol to make the solution turbid (typically ~10 mL). If phase separation occurs, n-butanol is added in 1 mL increments until the mixture is homogenous. The turbid solution is then centrifuged and the supernatant is decanted and discarded. The reddish-brown solid left behind is dissolved in ~5 mL n-hexane and filtered through a 0.2 µm syringe filter. Typical photoluminescence spectra give emission of 615±10 nm with a FWHM=60±5 nm.

Following is a table of data (peak emission (nm), width of the emission peak at half of the maximum peak height (FWHM) (nm), and photoluminescence quantum efficiency (PLQE) (measured vs. cresyl violet)) measurements for various ZnSe overcoated InP samples. (The InP cores and ZnSe shells of a given sample were generally prepared according to the procedure set forth in the Examples referenced for the given sample.)

Example 5

Overcoating InP Nanocrystals with $ZnSe_xS_{1-x}$

| Compound | CAS # | FW (g/mol)* | Moles (mmol)* | Amt Used |
|---|---|---|---|---|
| diethylzinc | 557-20-0 | 123.51 | 1.79 | 221 mg |
| trioctylphosphine selenide | 20612-73-1 | 449.60 (1M in TOP) | 0.89 | 0.89 mL |

-continued

| Compound | CAS # | FW (g/mol)* | Moles (mmol)* | Amt Used |
|---|---|---|---|---|
| bis-(trimethylsilyl) sulfide | 3385-94-2 | 178.44 | 1.79 | 319 mg |
| oleylamine | 112-90-3 | 267.49 | 6.08 | 2.0 mL |
| 1-octadecene (ODE) | 112-88-9 | 252.48 | | 5.0 mL |
| methyl myristate | 124-10-7 | 242.41 | | 5.0 mL |

*amounts vary depending on optical density of InP core solution used $ZnEt_2$ (Strem Chemicals) is filtered through a 0.2 μm syringe filter prior to use. Methyl myristate and bis-(trimethylsilyl) sulfide (Aldrich) is distilled under vacuum prior to use. 1-Octadecene (ODE) (Aldrich) is degassed at 150° C. under vacuum for several hours prior to use. n-Hexane, methanol and n-butanol (anhydrous grade) (Aldrich) are used without further purification. Oleylamine (Pfalz and Bauer) is distilled under vacuum prior to use. Trioctylphosphine selenide (TOP-Se) is synthesized by dissolving the appropriate amount of selenium shot into trioctylphosphine (TOP). Selenium and TOP (Strem) are used without further purification. Standard glove box and Schlenk techniques are used unless otherwise noted.

Methyl myristate and ODE are added by syringe into a preheated, evacuated 4-neck, 50 mL round bottom flask. (The setup included 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for 60 minutes and is then placed under an $N_2$ atmosphere.

Typical preparations involve using a 1.0 mL n-hexane solution of InP nanocrystals (where the 100-fold dilution has an optical density of 1.0 @350 nm).

The InP solution is prepared in the glove box and added by syringe into the pot containing the degassed solvent. n-Hexane is removed in vacuo (~30 minutes) and the flask is placed back under $N_2$ and heated to 200° C. TOP-Se and bis-(trimethylsilyl) sulfide are measured out into separate vials in the glove box and are each dissolved in ODE and diluted such that each has a total volume of 1.0 mL forming the selenide and sulfide precursor solutions, respectively. Diethylzinc is dissolved in 2.0 mL ODE forming the zinc precursor solution. The precursor solutions are loaded into three 5 mL syringes and removed from the glove box. Selenide and zinc precursor solutions are added slowly to the pot using a syringe pump and capillary tubing. Upon starting the syringe pump, 2.0 mL of oleylamine is rapidly injected into the flask containing the InP solution. Typical addition time of the zinc and selenium reagents is 1 h using an addition rate of 33 μL/min (2 mL/h). After the 2.0 mL of selenide precursor has been added, the syringe pump is stopped for ten minutes and the selenide precursor syringe is removed and replaced with the syringe containing the sulfide precursor solution. The syringe pumps are restarted and the sulfide precursor solution and remaining zinc precursor solution are added over a period of 1 h. After the zinc and sulfide precursor addition is completed, reaction mixture is allowed to slowly cool to ca. 70° C. over a course of 30 min.

The reaction is then added by syringe into an evacuated, septum capped vial for transport into the glove box. Upon cooling, a flocculent, white solid precipitates out of the red reaction mixture. The reaction mixture is reheated to ca. 70° C. to redissolve the white solid, forming a red, homogenous solution. The mixture is diluted with 10 mL n-hexane and centrifuged (4000 rpm for 5 min). The red supernatant is decanted and collected and the white solids are washed with n-hexane (~10 mL) and centrifuged again. The supernatant is decanted off and added to the first fraction. ~5 mL of n-butanol is added to the red nanocrystal solution followed by enough methanol to make the solution turbid (typically ~10 mL). If phase separation occurs, n-butanol is added in 1 mL increments until the mixture is homogenous. The turbid solution is then centrifuged and the supernatant is decanted and discarded. The reddish-brown solid left behind is dissolved in ~5 mL n-hexane and filtered through a 0.2 μm syringe filter. Typical photoluminescence spectra give emission of 615±10 nm with a FWHM=60-90 nm.

Following is a table of data (peak emission (nm), width of the emission peak at half of the maximum peak height (FWHM) (nm), and photoluminescence quantum efficiency (PLQE) (measured vs. cresyl violet)) measurements for various ZnSeS overcoated InP samples. (The InP cores and ZnSeS shells of a given sample were generally prepared according to the procedure set forth in the Examples referenced for the given sample.)

Example 6

Overcoating InP Nanocrystals with $ZnSe_xS_{1-x}$

| Compound | CAS # | FW (g/mol)* | Moles (mmol)* | Amt Used |
|---|---|---|---|---|
| diethylzinc | 557-20-0 | 123.51 | 1.64 | 202 mg |
| trioctylphosphine selenide | 20612-73-1 | 449.60 (1M in TOP) | 0.82 | 0.82 mL |
| bis-(trimethylsilyl) sulfide | 3385-94-2 | 178.44 | 1.64 | 292 mg |
| oleylamine | 112-90-3 | 267.49 | 6.08 | 2.0 mL |
| 1-octadecene (ODE) | 112-88-9 | 252.48 | | 5.0 mL |
| methyl myristate | 124-10-7 | 242.41 | | 5.0 mL |

*amounts vary depending on optical density of InP core solution used $ZnEt_2$ (Strem Chemicals) is filtered through a 0.2 μm syringe filter prior to use. Methyl myristate and bis-(trimethylsilyl) sulfide (Aldrich) is distilled under vacuum prior to use. 1-Octadecene (ODE) (Aldrich) is degassed at 150° C. under vacuum for several hours prior to use. n-Hexane, methanol and n-butanol (anhydrous grade) (Aldrich) are used without further purification. Oleylamine (Pfalz and Bauer) is distilled under vacuum prior to use. Trioctylphosphine selenide (TOP-Se) is synthesized by dissolving the appropriate amount of selenium shot into trioctylphosphine (TOP). Selenium and TOP (Strem) are used without further purification. Standard glove box and Schlenk techniques are used unless otherwise noted.

Methyl myristate and ODE are added by syringe into a preheated, evacuated 4-neck, 50 mL round bottom flask. (The setup included 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for 60 minutes and is then placed under an $N_2$ atmosphere.

Typical preparations involve using a 1.0 mL n-hexane solution of InP nanocrystals (where the 100-fold dilution has an optical density of 1.0 @350 nm).

The InP solution is prepared in the glove box and added by syringe into the pot containing the degassed solvent. n-Hexane is removed in vacuo (~30 minutes) and the flask is placed back under $N_2$ and heated to 200° C. TOP-Se and bis-(trimethylsilyl) sulfide are measured out into one vial in the glove box and are dissolved in ODE and diluted to a total volume of 2.0 mL forming the selenide/sulfide precursor solution. Diethylzinc is dissolved in 2.0 mL ODE forming the zinc precursor solution. The precursor solutions are loaded into two 5 mL syringes and removed from the glove box. Selenide/sulfide and zinc precursor solutions are added slowly to the pot using a syringe pump and capillary tubing. Upon starting the syringe pump, 2.0 mL of oleylamine is rapidly injected into the flask containing the InP solution. Typical addition time of the zinc and selenide/sulfide reagents is 1 h using an addition rate of 33 μL/min (2 mL/h). After the zinc and selenide/sulfide precursor addition is completed, reaction mixture is allowed to slowly cool to ca. 70° C. over a course of 30 min.

The reaction is then added by syringe into an evacuated, septum capped vial for transport into the glove box. Upon cooling, a flocculent, white solid precipitates out of the red reaction mixture. The reaction mixture is reheated to ca. 70° C. to redissolve the white solid, forming a red, homogenous solution. The mixture is diluted with 10 mL n-hexane and centrifuged (4000 rpm for 5 min). The red supernatant is decanted and collected and the white solids are washed with n-hexane (~10 mL) and centrifuged again. The supernatant is decanted off and added to the first fraction. ~5 mL of n-butanol is added to the red nanocrystal solution followed by enough methanol to make the solution turbid (typically ~10 mL). If phase separation occurs, n-butanol is added in 1 mL increments until the mixture is homogenous. The turbid solution is then centrifuged and the supernatant is decanted and discarded. The reddish-brown solid left behind is dissolved in ~5 mL n-hexane and filtered through a 0.2 μm syringe filter. Typical photoluminescence spectra give emission of 590±10 nm with a FWHM=65±5 nm.

Following is a table of data (peak emission (nm), width of the emission peak at half of the maximum peak height (FWHM) (nm), and photoluminescence quantum efficiency (PLQE) (measured vs. cresyl violet)) measurements for various ZnSeS overcoated InP samples. (The InP cores and ZnSeS shells of a given sample were generally prepared according to the procedure set forth in the Examples referenced for the given sample.)

Example 7

Overcoating InP Nanocrystals with $ZnSe_xS_{1-x}$

| Compound | CAS # | FW (g/mol)* | Moles (mmol)* | Amt Used |
|---|---|---|---|---|
| Diethylzinc | 557-20-0 | 123.51 | 1.31 | 161 mg |
| trioctylphosphine selenide | 20612-73-1 | 449.60 (1M in TOP) | 0.65 | 0.65 mL |
| bis-(trimethylsilyl) sulfide | 3385-94-2 | 178.44 | 0.65 | 117 mg |
| Oleylamine | 112-90-3 | 267.49 | 6.08 | 2.0 mL |
| squalane | 111-01-3 | 422.81 | | 5.0 mL |
| methyl myristate | 124-10-7 | 242.41 | | 5.0 mL |

*amounts vary depending on optical density of InP core solution used $ZnEt_2$ (Strem Chemicals) is filtered through a 0.2 μm syringe filter prior to use. Methyl myristate and bis-(trimethylsilyl) sulfide (Aldrich) is distilled under vacuum prior to use. Squalane (Aldrich) is degassed at 150° C. under vacuum for several hours prior to use. n-Hexane, methanol and n-butanol (anhydrous grade) (Aldrich) are used without further purification. Oleylamine (Pfalz and Bauer) is distilled under vacuum prior to use. Trioctylphosphine selenide (TOP-Se) is synthesized by dissolving the appropriate amount of selenium shot into trioctylphosphine (TOP). Selenium and TOP (Strem) are used without further purification. Standard glove box and Schlenk techniques are used unless otherwise noted.

Methyl myristate and squalane are added by syringe into a preheated, evacuated 4-neck, 50 mL round bottom flask. (The setup included 4-neck, 50 mL round bottom flask equipped with a stir bar, thermocouple temperature probe, condenser w/ $N_2$/vacuum inlet/outlet, and septa on the two remaining necks. All connections are standard 14/20 ground glass joints lubricated with silicone grease—except septa, which are secured with copper wire. The flask is heated with a heating mantle connected to a digital temperature controller.) The reaction medium is degassed at 70° C. for 60 minutes and is then placed under an $N_2$ atmosphere.

Typical preparations involve using a 1.0 mL n-hexane solution of InP nanocrystals (where the 100-fold dilution has an optical density of 1.0 @350 nm).

The InP solution is prepared in the glove box and added by syringe into the pot containing the degassed solvent. n-Hexane is removed in vacuo (~30 minutes) and the flask is placed back under $N_2$ and heated to 200° C. TOP-Se and bis-(trimethylsilyl) sulfide are measured out into one vial in the glove box and are dissolved in squalane and diluted to a total volume of 2.0 mL forming the selenide/sulfide precursor solution. Diethylzinc is dissolved in 2.0 mL squalane forming the zinc precursor solution. The precursor solutions are loaded into two 5 mL syringes and removed from the glove box. Selenide/sulfide and zinc precursor solutions are added slowly to the pot using a syringe pump and capillary tubing. Upon starting the syringe pump, 2.0 mL of oleylamine is rapidly injected into the flask containing the InP solution. Typical addition time of the zinc and selenide/sulfide reagents is 2 h using an addition rate of 1.00 mL/h. After the zinc and selenide/sulfide precursor addition is completed, reaction mixture is allowed to slowly cool to ca. 70° C. over a course of 30 min.

The reaction is then added by syringe into an evacuated, septum capped vial for transport into the glove box. Upon cooling, a flocculent, white solid precipitates out of the red reaction mixture. The reaction mixture is reheated to ca. 70° C. to redissolve the white solid, forming a red, homogenous solution. The mixture is diluted with 10 mL n-hexane and centrifuged (4000 rpm for 5 min). The red supernatant is decanted and collected and the white solids are washed with n-hexane (~10 mL) and centrifuged again. The supernatant is decanted off and added to the first fraction. ~10 mL of n-butanol is added to the red nanocrystal solution followed by enough methanol to make the solution turbid (typically ~10 mL). If phase separation occurs, n-butanol is added in 1 mL increments until the mixture is homogenous. The turbid solution is then centrifuged and the supernatant is decanted and discarded. The reddish-brown solid left behind is dissolved in ~5 mL n-hexane and filtered through a 0.2 μm syringe filter. Typical photoluminescence spectra give emission of 600±10 nm with a FWHM=60±5 nm.

The size distribution of InP nanocrystals overcoated with $ZnSe_xS_{1-x}$ using squalane (as described in Example 7) is narrower than that obtained when carrying out the overcoating process using ODE.

Following is a table of data (peak emission (nm), width of the emission peak at half of the maximum peak height (FWHM) (nm), and photoluminescence quantum efficiency (PLQE) (measured vs. cresyl violet)) measurements for various ZnSeS overcoated InP samples. (The InP cores and ZnSeS shells of a given sample were generally prepared according to the procedure set forth in the Examples referenced for the given sample.)

length, and in general using the exact parameters not explicitly listed here for both unknown and standard (i.e. PL spectrometer slit widths). A regression line is fitted to the curve from the unknown nanocrystal data giving a straight line that passes through the origin with a slope of $m_{nanocrystal}$. Fluorescence quantum yield is calculated using the following equation:

$$\Phi_{nanocrystal} = \Phi_{standard} * (m_{nanocrystal}/m_{standard}) * (\eta_{nanocrystal}^2/\eta_{standard}^2)$$

wherein $\Phi_{standard}$=0.54 (quantum yield of cresyl violet), $m_{nanocrystal}$ and $m_{standard}$ are the slopes calculated as described above, $\eta_{nanocrystal}$ is the refractive index of the solvent used to solvate the nanocrystals (n-hexane, 1.375), and $\eta_{standard}$ is the refractive index of the solvent used to solvate the cresyl violet standard (methanol, 1.328).

| Sample | InP Prep. Method (Example #) | InP Core Peak Emission (nm) | InP Core FWHM (nm) | InP Core PLQE (%) | ZnSe Prep. Method (Example #) | Core/Shell Peak Emission (nm) | Core/Shell FWHM (nm) | Core/Shell PLQE (%) |
|---|---|---|---|---|---|---|---|---|
| A | 1 | 613 | 51 | — | 4 | 609 | 63 | 31 |
| B | 2 | 578 | 44 | — | 5 | 612 | 81 | 36 |
| C | 2 | 573 | 43 | — | 6 | 597 | 62 | 39 |
| D | 2 | 572 | 52 | — | 6 | 584 | 63 | 31 |
| E | 2 | 572 | 48 | — | 7 | 604 | 55 | 34 |

In the foregoing table, the photoluminescence quantum efficiency is measured by comparison to cresyl violet (cresyl violet 670 perchlorate, Exciton product #06700) in methanol following the method described by Williams, et. al. in "Relative fluorescence quantum yields using a computer controlled luminescence spectrometer," *Analyst*, 1983, 108, 1067. Cresyl violet, which has a reported quantum yield of 54% as described in *J. Phys. Chem.*, 1979, 83, 696, is used to calculate quantum yields of unknown semiconductor nanocrystal samples in n-hexane by comparison. A series of UV/Vis and PL spectra are taken for several different concentrations of cresyl violet in methanol (keeping the optical density below 0.1 to avoid re-absorption effects, as described by Dhami, et. al. in "Pthalocyanine fluorescence at high concentration: dimers or reabsorption effect?" *Photochem. Photobiol.*, 1995, 61, 341). Integrated intensity of fluorescence is plotted vs. absorbance and a regression line is fitted to the curve, giving a straight line that passes through the origin and has a slope of $m_{standard}$. The unknown nanocrystal sample in hexane is submitted to the same experiment, i.e. UV/Vis and PL spectra are taken at several concentrations and integrated intensity of fluorescence is plotted vs. absorbance. It is important to note that the spectra for the standard and the unknown are taken using roughly the same concentration ranges, over the same spectral range, using the same excitation wave- Example 8

InP Nanocrystal Preparation

A. Preparation of the Flask Solution:

In the glove box, 514 mg (3.0 equivalents) of myristic acid and 215 mg (1.2 equivalents) of amine are weighed out in a septum capped vial.

9 mL of squalane was added to the septum capped vial. The vial was closed well, brought out of the glove box and heated to 70° C. in an oil bath under nitrogen atmosphere to dissolve the ligands in squalane.

When the solution became clear after complete dissolution of the ligands in squalane, the solution is syringed out of the vial and injected into a preheated, evacuated 4-neck, 50 mL round bottom flask. (Standard indium phosphide setup was used; 4-neck, 50 mL RB was equipped with a stir bar, thermocouple temperature probe, condenser w/ $N_2$/vacuum inlet/outlet, and septa on the remaining necks. All connections were standard 14/20 ground glass joints lubricated with silicone grease—except septa, which were secured with copper wire. The flask was evacuated at 100° C. heated with a heating mantle connected to a digital temperature controller.)

The contents were further degassed again at 100° C. for approximately 60 minutes. The contents of the ligand solution along with the equivalents and moles used are given in the table below.

| Compound | CAS # | FW (g/mol) | moles (mmol) | Equivalents | Quantity | Units |
|---|---|---|---|---|---|---|
| Myristic acid | 544-63-8 | 228.37 | 2.250733459 | 3.0 | 497 | mg |
| Dioctylamine | 1120-48-5 | 241.46 | 0.890416632 | 1.2 | 235 | mg |
| Squalane | 111-01-3 | 422.81 | | Solvent | 9 | mL |

B. Preparation of Solutions of the Precursors for Injection:
In the Glove Box:

120 mg (1 equivalent) of trimethyl indium was dissolved in 3 mL of octyl ether in a septum capped vial. The solution is then transferred from the vial into a 5 mL syringe fitted with a gauge 12 needle. The syringe tip is then capped by the empty septum capped vial to avoid any air contamination (when the syringes are brought out of the glove box).

94 mg (0.5 equivalents) of tris-(trimethylsilyl)-phosphine was dissolved in 3 mL of squalane in another septum capped vial. This solution is again transferred into a separate 5 mL syringe fitted with a gauge 12 needle. The syringe tip is again capped by the empty septum capped vial similar to that of the syringe containing trimethyl indium. The reagents and the solvents used for injection are given in the table below.

Syringe 1:

| Compound | CAS# | FW (g/mol) | Moles (mmol) | Equivalents | Quantity | Units |
|---|---|---|---|---|---|---|
| InMe$_3$ | 15573-38-3 | 250.54 | 0.750328269 | 1 | 120 | mg |
| Octyl ether | 629-82-3 | 242.44 | | Solvent | 3 | mL |

Syringe 2:

| Compound | CAS # | FW (g/mol) | Moles (mmol) | Equivalents | Quantity | Units |
|---|---|---|---|---|---|---|
| P(TMS)$_3$ | 15573-38-3 | 250.54 | 0.37518959 | 0.500033927 | 94 | mg |
| Squalane | 111-01-3 | 422.81 | | Solvent | 3 | mL |

The reaction flask containing the ligand solution is backfilled with nitrogen and maintained under nitrogen atmosphere. Any deposition of ligand material at the top of the flask was melted down into the flask solution by gently heating the top outer surface of the flask and the condenser with a heat gun. The temperature of the flask was then raised to 260° C.

The vial capped syringes containing the precursor solutions (trimethyl indium and tris-(trimethylsilyl)-phosphine) were brought out of the glove box and kept inserted in the septa of the flask (ready for injection).

When the temperature reaches above 260° C., the temperature of the temperature controller is reduced to 205° C. When the temperature of the flask drops just to 260° C., the precursor solutions are injected rapidly from the syringes into the contents of the flask and a stop clock was simultaneously started to monitor the time of the reaction. Due to injection, the temperature generally dropped to 202° C. During the reaction, the temperature of the flask was generally maintained between 202° C. and 210° C.

During the reaction, samples of the reaction mixture are extracted through 1 mL syringes fitted with longer needles and analyzed for absorption and emission wavelengths and the corresponding full width half maximum of the emission wavelength peak using the respective Varian spectrophotometer.

When the emission wavelength reached 574 nm with a full width half maximum value of 48 nm, the reaction mixture was cooled rapidly using an ice bath to room temperature.

The cooled reaction mixture was then transferred into an evacuated septum capped vial using a 20 mL syringe and the septum capped vial was taken into the glove box to isolate the nanoparticles from the reaction mixture.

C. Preparation of the Ligand Solution:

| Myristic Acid | Dioctyl amine (mg) | Squalane (ml) | Degassing time (min) | Degas temperature (° C.) |
|---|---|---|---|---|
| 514 | 215 | 9 | 60 | 100 |

D. Injection Reagents and Injection Conditions:

| Syringe 1 | | Syringe 2 | | Injection Temperature (° C.) | Post-injection Temperature (° C.) |
|---|---|---|---|---|---|
| InMe$_3$ (mg) | Octyl ether (ml) | P(TMS)$_3$ (mg) | Squalane (ml) | | |
| 120 | 3 | 94 | 3 | 260 | 202 |

E. Other Details:

| Growth Temperature (° C.) | Reaction Time(min) | Sampling (minutes) | Quenching |
|---|---|---|---|
| 205 | 37 | 15, 35, 48, 60 | Ice bath cooling |

F. Experimental Results:

| Time (min) | Absorption (λ) | Emission (λ) | FWHM (λ) |
|---|---|---|---|
| 15 | 497 | 542 | Broad |
| 35 | 525 | 561 | 42 |
| 48 | 533 | 570 | 45 |
| 60 | 538 | 574 | 48 |

G. Clean Up and Preparation of Red Core Particles:

Inside the glove box, the crude reaction mixture of core nanoparticles is completely dissolved in about 3 mL of hexanes and transferred into a centrifuge tube.

To this solution, about 20 mL of n-butanol was added. The solution remains clear at this stage. To this solution, about 19 mL of methanol was added slowly until the solution becomes turbid.

The turbid solution in the centrifuge tube was centrifuged in a centrifuge for 5 minutes at 4000 revolutions per minute.

After centrifuging, the supernatant solution is discarded and the deposited core nanoparticles were dissolved in 5 mL of hexanes. The core nanoparticles solution was then transferred into a septum capped vial and stored in the glove box until it is needed for overcoating.

The quantum yield of the core particles after isolation from the crude reaction mixture was found to be 8%.

Example 9

InP Nanocrystal Preparation

A. Preparation of the Flask Solution:

In the glove box, 497 mg (2.9 equivalents) of myristic acid and 235 mg (1.3 equivalents) of amine are weighed out in a septum capped vial.

9 mL of squalane was added to the septum capped vial. The vial was closed well, brought out of the glove box and heated to 70° C. in an oil bath under nitrogen atmosphere to dissolve the ligands in squalane.

When the solution became clear after complete dissolution of the ligands in squalane, the solution was syringed out of the vial and injected into a preheated, evacuated 4-neck, 50 mL round bottom flask. (Standard indium phosphide setup was used; 4-neck, 50 mL RB was equipped with a stir bar, thermocouple temperature probe, condenser w/ $N_2$/vacuum inlet/outlet, and septa on the remaining necks. All connections were standard 14/20 ground glass joints lubricated with silicone grease—except septa, which were secured with copper wire. The flask was evacuated at 100° C. heated with a heating mantle connected to a digital temperature controller.)

The contents were further degassed again at 70° C. for approximately 60 minutes. The contents of the ligand solution along with the equivalents and moles used are given in the table below.

| Compound | CAS # | FW (g/mol) | moles (mmol) | equiv. | Quantity | Quantity |
|---|---|---|---|---|---|---|
| Myristic acid | 544-63-8 | 228.37 | 2.175951980 | 2.9 | 497 | mg |
| Dioctyl amine | 1120-48-5 | 241.46 | 0.975426750 | 1.3 | 235 | mg |
| Squalane | 111-01-3 | 422.81 | | Solvent | 9 | mL |

B. Preparation of Solutions of the Precursors for Injection:

In the Glove Box:

120 mg (1 equivalent) of trimethyl indium was dissolved in 3 mL of Dowtherm A in a septum capped vial. The solution is then transferred from the vial into a 5 mL syringe fitted with a gauge 12 needle. The syringe tip is then capped by the empty septum capped vial to avoid any air contamination (when the syringes are brought out of the glove box).

94 mg (0.5 equivalents) of tris-(trimethylsilyl)-phosphine was dissolved in 3 mL of squalane in another septum capped vial. This solution was again transferred into a separate 5 mL syringe fitted with a gauge 12 needle. The syringe tip was again capped by the empty septum capped vial similar to that of the syringe containing indium phosphide. The reagents and the solvents used for injection are given in the table below.

Syringe 1:

| Compound | CAS# | FW(g/mol) | Moles (mmol) | Equivalents | Quantity | Quantity |
|---|---|---|---|---|---|---|
| InMe$_3$ | 15573-38-3 | 250.54 | 0.750328269 | 1 | 120 | mg |
| Dowtherm A | 8004-13-5 | | | Solvent | 3 | mL |

Syringe 2:

| Compound | CAS # | FW(g/mol) | Moles (mmol) | Equivalents | Quantity | Quantity |
|---|---|---|---|---|---|---|
| P(TMS)$_3$ | 15573-38-3 | 250.54 | 0.37518959 | 0.500033927 | 94 | mg |
| Squalane | 111-01-3 | 422.81 | | Solvent | 3 | mL |

The reaction flask containing the ligand solution is backfilled with nitrogen and maintained under nitrogen atmosphere. Any deposition of ligand material at the top of the flask was melted down into the flask solution by gently heating the top outer surface of the flask and the condenser with a heat gun. The temperature of the flask was then raised to 220° C.

The vial capped syringes containing the precursor solutions (trimethyl indium and tris-(trimethylsilyl)-phosphine) were brought out of the glove box and kept inserted in the septa of the flask (ready for injection).

When the temperature reached above 220° C., the temperature of the temperature controller was reduced to 175° C. When the temperature of the flask drops just to 220° C., the precursor solutions were injected rapidly from the syringes into the contents of the flask and a stop clock is simultaneously started to monitor the time of the reaction. Due to injection, the temperature generally dropped to 172° C. During the reaction, the temperature of the flask is generally maintained between 172° C. and 180° C.

During the reaction, samples of the reaction mixture are extracted through 1 mL syringes fitted with longer needles and analyzed for absorption and emission wavelengths and the corresponding full width half maximum of the emission wavelength peak using the respective Varian spectrophotometer.

When the emission wavelength reached 558 nm with a full width half maximum value of 44 nm, the reaction mixture was cooled rapidly using an ice bath to room temperature. The quantum yield of the crude solution was found to be 3.8%

The cooled reaction mixture was then transferred into an evacuated septum capped vial using a 20 mL syringe and the septum capped vial was taken into the glove box to isolate the nanoparticles from the crude reaction mixture.

The data observed during the course of the reaction is tabulated below along with the vital conditions used for the reaction.

C. Preparation of the Ligand Solution:

| Myristic Acid | Dioctyl amine (mg) | Squalane (ml) | Degassing time (min) | Degas temperature (° C.) |
|---|---|---|---|---|
| 497 | 235 | 9 | 60 | 100 |

D. Injection Reagents and Injection Conditions:

| Syringe 1 | | Syringe 2 | | Injection | Post-injection |
|---|---|---|---|---|---|
| InMe$_3$ (mg) | Dowtherm A (ml) | P(TMS)$_3$ (mg) | Squalane (ml) | Temperature (° C.) | Temperature (° C.) |
| 120 | 3 | 94 | 3 | 220 | 172 |

E. Other Details:

| Growth Temperature (° C.) | Reaction Time (min) | Sampling | Quenching |
|---|---|---|---|
| 172-180 | 92 | 10, 20, 35, 50, 70, 80, 90, 92 | Ice bath cooling |

F. Experimental Results:

| Time (min) | Absorption (λ) | Emission (λ) | FWHM (λ) |
|---|---|---|---|
| 10 | 442 | 603 | Broad |
| 20 | 449 | 604 | Broad |
| 35 | 464 | 529/602 | Broad |
| 50 | 484 | 536 | Broad |
| 70 | 498 | 543 | 47 |
| 80 | 507 | 553 | 48 |
| 90 | 510 | 558 | 44 |
| 92 | 515 | 558 | 44 |

G. Clean Up and Preparation of Red Core Particles:

Inside the glove box, the crude reaction mixture of core nanoparticles was completely dissolved in about 3 mL of hexanes and transferred into a centrifuge tube.

To this solution, about 20 mL of n-butanol was added. The solution remains clear at this stage. To this solution, about 18 mL of methanol is added slowly until the solution becomes turbid.

The turbid solution in the centrifuge tube is centrifuged in a centrifuge for 5 minutes at 4000 revolutions per minute.

After centrifuging, the supernatant solution is discarded and the deposited core nanoparticles were dissolved in 5 mL of hexanes. The core nanoparticles solution was then transferred into a septum capped vial and stored in the glove box until it is needed for overcoating.

The quantum yield of the core nanoparticles after isolation from the crude reaction mixture was found to be 4%.

Example 10

Overcoating InP Nanocrystals with $ZnSe_xS_{1-x}$

A. Equivalent Amount of Cores, Reagents and Solvents

| Compound | CAS number | FW (g/mol) | Moles (mmol) | Amount Used |
|---|---|---|---|---|
| Indium phosphide Core | | | $0.096^a$ | |
| Diethylzinc | 557-20-0 | 123.51 | $1.1^b$ | 131 mg/111 ul |
| Bis-(trimethylsilyl) sulfide | 3385-94-2 | 178.44 | $0.53^b$ | 95 mg/112 ul |
| 1M trioctylphosphine selenide | | n/a | $0.53^b$ | 0.53 ml |
| Oleylamine | 112-90-3 | 267.49 | 6.08 | 2.0 ml |
| Squalane | 111-01-3 | 422.81 | | 9.0 ml |
| Methylmyristate | 124-10-7 | 242.41 | | 5.0 ml |

$^a$The mole amount of InP is calculated using 'InP-overcoating spreadsheet', based on the absorption peak wavelength and the optical density at 350 nm of 100-fold dilution of the InP solution. The number between 0.070 mmol to 1.2 mmol is acceptable.
$^b$The mole amount and ratios vary depending on the amount of InP, a number of shell layers, and a percentage of sulfur vs. selenium. The numbers above mentioned are based on 15 shell layers made up of $ZnSe_{0.5}S_{0.5}$ for InP cores with absorption peak at 513 nm.

B. General Preparation

All cores, reagents and solvents are kept in a glove box after appropriate air-free treatment. Standard glove box and Schlenk techniques are used unless otherwise mentioned. Diethylzinc is filtered through a 0.2 μm syringe filter prior to use and kept in freezer. Methyl myristate and oleylamine are distilled under vacuum, and squalane is degassed under vacuum at high temperature prior to use. 1M trioctylphosphine selenide (TOP-Se) is prepared by dissolving selenium shot in trioctylphosphine.

C. Synthesis Procedures 5 ml of squalane and 5 ml of methyl myristate are transferred into the pot which has been preheated at 100° C. and evacuated for 30 min. (The setup includes a 4-neck, 50 mL round bottom flask equipped with a stir bar, a temperature probe and a condenser connected to a $N_2$/vacuum source (Schlenk line). The flask is heated with a heating mantle connected to a digital temperature controller. The solvent is degassed at 75° C. for one hour and is then placed under $N_2$ atmosphere.

The InP solution in n-hexane is prepared in a glove box and syringed into the pot containing the degassed solvent. n-Hexane is removed by vacuum at 75° C. for one hour and then the pot is placed back under $N_2$ atmosphere. The Zn, Se and S precursor solutions are prepared in a glove box. The calculated amount of 1M TOP-Se and bis-(trimethylsilyl) sulfide is measured out in one vial and loaded into a 5 ml syringe, diluting with squalane up to the total volume of 2.0 ml forming the selenide/sulfide precursor solution. The corresponding amount of diethylzinc is measured in a vial and loaded into another 5 ml syringe with squalane forming a total of 2.0 ml of zinc precursor solution. When the pot is under $N_2$ atmosphere at 75° C. after all of the n-hexane has been removed, the two precursor syringes are taken out from the glove box and connected to capillary tubes and then loaded into a syringe pump. The two ends of the capillaries are plunged into the flask. The temperature is set to 200° C., and once it reaches 170° C. the precursor solutions are injected at the rate of 2 ml/hr. A few minutes later when the temperature is at 200° C., 2 ml of oleylamine is injected into the flask. When the addition is complete, the overcoated nanocrystals are preferably annealed prior to crash-out (e.g., precipitation from the reaction mixture) e.g., the temperature is set to 150° C. and left overnight under $N_2$ atmosphere. The next day the solution is then syringed into an evacuated, septum-capped vial for transport into a glove box.

D. Crashing-Out Procedures

Upon cooling, a flocculent, reddish solid precipitates out of the red reaction mixture. The reaction mixture is reheated to 70° C. to re-dissolve the solid, forming a red, homogenous solution. The mixture is diluted with 20 ml of n-hexane and cooled down long enough for the solid to precipitate. After being centrifuged (4000 rpm for 8 min), the red supernatant is decanted and collected and the reddish solids are washed with 10 ml of n-hexane and centrifuged again. The supernatant is decanted off and added to the first fraction. 20 ml of n-butanol is added to the red nanocrystal solution followed by enough methanol to make the solution turbid (typically ~20 ml). The turbid solution is then centrifuged and the supernatant is decanted and discarded. The reddish solid left behind is dissolved in 5 ml n-hexane and filtered through a 0.2 μm PTFE syringe filter. Optical properties are obtained in dilute n-hexane solution. Photophysical spectra give the first absorption peak of 540-545 nm and emission peak of 570-575 nm with a FWHM=50-55 nm and a quantum yield of 55-60%.

Example 11

InP Nanocrystal Preparation

A. Preparation of the Ligand Solution:

In the glove box, 514 mg (3.21 equivalents) of myristic acid and 215 mg (1.29 equivalents) of amine are weighed out in a septum capped vial.

9 mL of squalane was added to the septum capped vial. The vial was closed well, brought out of the glove box and heated to 70° C. in an oil bath under nitrogen atmosphere to dissolve the ligands in squalane.

When the solution became clear after complete dissolution of the ligands in squalane, the solution is syringed out of the vial and injected into a preheated, evacuated 4-neck, 50 mL round bottom flask. (Standard indium phosphide setup was used; 4-neck, 50 mL RB was equipped with a stir bar, thermocouple temperature probe, condenser w/ $N_2$/vacuum inlet/outlet, and septa on the remaining necks. All connections were standard 14/20 ground glass joints lubricated with silicone grease—except septa, which were secured with copper wire. Flask was evacuated at 100° C. heated with a heating mantle connected to a digital temperature controller.)

The contents were further degassed again at 100° C. for approximately 60 minutes. The contents of the ligand solution along with the equivalents and moles used are given in the table below.

| Compound | CAS # | FW (g/mol) | moles (mmol) | Equivalents | Quantity | Units |
|---|---|---|---|---|---|---|
| Myristic acid | 544-63-8 | 228.37 | 3.4086 | 3.21 | 550 | mg |
| Dioctylamine | 1120-48-5 | 241.46 | 0.9679 | 1.29 | 234 | mg |
| Squalane | 111-01-3 | 422.81 | | Solvent | 13 | mL |

B. Preparation of Solutions of the Precursors for Injection:

In the Glove Box, 120 mg (1 equivalent) of trimethyl indium was dissolved in 1 mL of octyl ether in a septum capped vial. The solution is then transferred from the vial into a 3 mL syringe fitted with a gauge 12 needle. The syringe tip is then capped by the empty septum capped vial to avoid any air contamination (when the syringes are brought out of the glove box).

94 mg (0.5 equivalents) of tris-(trimethylsilyl)-phosphine was dissolved in 1 mL of squalane in another septum capped vial. This solution is again transferred into a separate 3 mL syringe fitted with a gauge 12 needle. The syringe tip is again capped by the empty septum capped vial similar to that of the syringe containing trimethyl indium. The reagents and the solvents used for injection are given in the table below.

Syringe 1:

| Compound | CAS# | FW (g/mol) | Moles (mmol) | Equivalents | Quantity | Units |
|---|---|---|---|---|---|---|
| InMe$_3$ | 15573-38-3 | 250.54 | 0.750328269 | 1 | 120 | mg |
| Octyl ether | 629-82-3 | 242.44 | | Solvent | 1 | mL |

Syringe 2:

| Compound | CAS # | FW (g/mol) | Moles (mmol) | Equivalents | Quantity | Units |
|---|---|---|---|---|---|---|
| P(TMS)$_3$ | 15573-38-3 | 250.54 | 0.37518959 | 0.500033927 | 94 | mg |
| Squalane | 111-01-3 | 422.81 | | Solvent | 1 | mL |

The reaction flask containing the ligand solution is back-filled with nitrogen and maintained under nitrogen atmosphere. Any deposition of ligand material at the top of the flask was melted down into the flask solution by gently heating the top outer surface of the flask and the condenser with a heat gun. The temperature of the flask was then raised to 175° C.

The vial capped syringes containing the precursor solutions (trimethyl indium and tristrimethylsilyl phosphine) were brought out of the glove box and kept inserted in the septa of the flask (ready for injection).

When the temperature reached above 175° C., the temperature of the temperature controller is reduced to 168° C. When the temperature of the flask dropped just to 175° C., the precursor solutions are injected rapidly from the syringes into the contents of the flask and a stop clock was simultaneously started to monitor the time of the reaction. Due to injection, the temperature generally dropped to 168° C. During the reaction, the temperature of the flask was generally maintained between 165° C. and 171° C.

During the reaction, samples of the reaction mixture are extracted through 1 mL syringes fitted with longer needles and analyzed for absorption and emission wavelengths and the corresponding full width half maximum of the emission wavelength peak using the respective Varian spectrophotometer.

When the emission wavelength reached 617 nm with a full width half maximum value of 57 nm, the reaction mixture was cooled rapidly using an ice bath to room temperature.

The cooled reaction mixture was then transferred into an evacuated septum capped vial using a 20 mL syringe and the septum capped vial was taken into the glove box to isolate the nanoparticles from the reaction mixture.

C. Preparation of the Ligand Solution:

| Myristic Acid | Dioctyl amine (mg) | Squalane (ml) | Degassing time (min) | Degas temperature (° C.) |
|---|---|---|---|---|
| 550 | 234 | 13 | 60 | 100 |

D. Injection Reagents and Injection Conditions:

| Syringe 1 | | Syringe 2 | | Injection | Post-injection |
|---|---|---|---|---|---|
| InMe$_3$ (mg) | Octyl ether (ml) | P(TMS)$_3$ (mg) | Squalane (ml) | Temperature (° C.) | Temperature (° C.) |
| 120 | 3 | 94 | 3 | 175 | 168 |

E. Other Details:

| Growth Temperature (° C.) | Reaction Time (min) | Sampling | Quenching |
|---|---|---|---|
| 165-171 | 20 | 2, 4, 6, 8, 10, 15, 20 | Ice bath cooling |

F. Experimental Results:

| Time (min) | Absorption ($\lambda$) | Emission ($\lambda$) | FWHM ($\lambda$) |
|---|---|---|---|
| 2 | 535 | 588 | 61 |
| 4 | 543 | 593 | 54 |
| 6 | 553 | 598 | 52 |
| 8 | 559 | 606 | 53 |
| 10 | 567 | 607 | 54 |
| 15 | 572 | 613 | 58 |
| 20 | 579 | 617 | 57 |

Example 12

InP Nanocrystal Preparation

A. Preparation of the Ligand Solution:

In the glove box, 272 mg (1.5 equivalents) of amine is weighed out in a 20 mL vial. 9 mL of squalane was added to the 20 mL vial. The contents of the vial were mixed well and transferred into a 10 mL syringe. The needle of the syringe was capped with the needle cap.

The syringe was brought out of the glove box and its contents were injected into a preheated, evacuated 4-neck, 50 mL round bottom flask. (Standard indium phosphide setup was used; 4-neck, 50 mL RB was equipped with a stir bar, thermocouple temperature probe, condenser w/ $N_2$/vacuum inlet/outlet, and septa on the remaining necks. All connections were standard 14/20 ground glass joints lubricated with silicone grease—except septa, which were secured with copper wire. Flask was evacuated at 100° C. heated with a heating mantle connected to a digital temperature controller.)

The contents were further degassed again at 100° C. for approximately 60 minutes. The contents of the ligand solution along with the equivalents and moles used are given in the table below.

| Compound | CAS # | FW (g/mol) | moles (mmol) | Equivalents | Quantity | Units |
|---|---|---|---|---|---|---|
| Dioctylamine | 1120-48-5 | 241.46 | 1.1255 | 1.29 | 272 | mg |
| Squalane | 111-01-3 | 422.81 | | Solvent | 11 | mL |

B. Preparation of Solutions of the Precursors for Injection:
In the Glove Box, 531 mg (3.1 equivalents) of myristic acid was weighed out in a septum capped vial. 2 mL of squalane was added to the vial. The vial was capped tightly.

120 mg (1 equivalent) of trimethyl indium was dissolved in 1 mL of octyl ether in a septum capped vial. The solution is then transferred from the vial into a 3 mL syringe fitted with a gauge 12 needle. The syringe tip was then capped by the empty septum capped vial to avoid any air contamination (when the syringes are brought out of the glove box).

94 mg (0.5 equivalents) of tris-(trimethylsilyl)-phosphine was dissolved in 1 mL of squalane in another septum capped vial. This solution is again transferred into a separate 3 mL syringe fitted with a gauge 12 needle. The syringe tip is again capped by the empty septum capped vial similar to that of the syringe containing trimethyl indium. The reagents and the solvents used for injection are given in the table below.

Syringe 1:

| Compound | CAS# | FW (g/mol) | Moles (mmol) | Equivalents | Quantity | Units |
|---|---|---|---|---|---|---|
| InMe$_3$ | 15573-38-3 | 250.54 | 0.750328269 | 1 | 120 | mg |
| Octyl ether | 629-82-3 | 242.44 | | Solvent | 1 | mL |

Syringe 2:

| Compound | CAS # | FW (g/mol) | Moles (mmol) | Equivalents | Quantity | Units |
|---|---|---|---|---|---|---|
| P(TMS)$_3$ | 15573-38-3 | 250.54 | 0.37518959 | 0.500033927 | 94 | mg |
| Squalane | 111-01-3 | 422.81 | | Solvent | 1 | mL |

The reaction flask containing the ligand solution is back-filled with nitrogen and maintained under nitrogen atmosphere. The temperature of the flask was then raised to 185 C.

The two syringes and the vial containing the myristic acid were brought out of the glove box. The vial capped syringes containing the precursor solutions (trimethyl indium and tris-(trimethylsilyl)-phosphine) were kept inserted in the septa of the flask (ready for injection).

In the meantime, the septum capped vial containing myristic acid was heated in an oil bath under nitrogen atmosphere at 70° C. to dissolve all the myristic acid.

When the temperature of the flask stabilized at 185° C., the precursor solutions were injected rapidly from the syringes into the contents of the flask. The temperature dropped to around 170° C. While the temperature was allowed to rise back to 185° C., the heated myristic acid solution was transferred into a 5 mL syringe, fitted with a gauge 12 needle and kept inserted in the septum of the flask ready for injection. It took approximately 3 to 4 minutes for the temperature to rise back to 185° C.

Syringe 3:

| Compound | CAS # | FW (g/mol) | Moles (mmol) | Equivalents | Quantity | Units |
|---|---|---|---|---|---|---|
| Myristic acid | 544-63-8 | 228.37 | 2.33 | 3.10 | 531 | mg |
| Squalane | 111-01-3 | 422.81 | | | 2 | mL |

When the temperature rose back to 185° C., the myristic acid solution was rapidly injected into the contents of the flask and a stop clock was simultaneously started to monitor the time of the reaction. The temperature dropped to 174° C. The temperature in the digital temperature controller was set to 175° C. and maintained between 172° C. and 180° C. during the reaction. During the reaction, samples of the reaction mixture were extracted through 1 mL syringes fitted with longer needles and analyzed for absorption and emission wavelengths and the corresponding full width half maximum of the emission wavelength peak using the respective Varian spectrophotometer.

When the emission wavelength reached 605 nm with a full width half maximum value of 56 nm, the reaction mixture was cooled rapidly using an ice bath to room temperature.

The cooled reaction mixture was then transferred into an evacuated septum capped vial using a 20 mL syringe and the septum capped vial was taken into the glove box to isolate the nanoparticles from the reaction mixture.

C. Preparation of the Ligand Solution:

| Dioctyl amine (mg) | Squalane (ml) | Degassing time (min) | Degas temperature (° C.) |
|---|---|---|---|
| 234 | 11 | 60 | 100 |

D. Injection Reagents and Injection Conditions:

| Syringe 1 | | Syringe 2 | | Injection | Post-injection |
|---|---|---|---|---|---|
| InMe₃ (mg) | Octyl ether (ml) | P(TMS)₃ (mg) | Squalane (ml) | Temperature (° C.) | Temperature (° C.) |
| 120 | 1 | 94 | 1 | 185 | 170 |

| Syringe 3 | | Injection | Post-injection |
|---|---|---|---|
| Myristic acid (mg) | Squalane (ml) | Temperature (° C.) | Temperature (° C.) |
| 531 | 2 | 185 | 174 |

E. Other Details:

| Growth Temperature (° C.) | Reaction Time (min) | Sampling | Quenching |
|---|---|---|---|
| 172-180 | 20 | 5, 8, 13, 18, 23, 30, 37 | Ice bath cooling |

F. Experimental Results:

| Time (min) | Absorption (λ) | Emission (λ) | FWHM (λ) |
|---|---|---|---|
| 5 | 500 | 552 | 57 |
| 8 | 516 | 558 | 51 |
| 13 | 519 | 563 | 49 |
| 18 | 527 | 573 | 51 |
| 23 | 538 | 576 | 55 |
| 30 | 548 | 582 | 58 |
| 37 | 555 | 605 | 56 |

The foregoing description and example have been set forth merely to illustrate the invention and are not intended as being limiting. Each of the disclosed aspects and embodiments of the present invention may be considered individually or in combination with other aspects, embodiments, and variations of the invention.

In addition, unless otherwise specified, none of the steps of the methods of the present invention are confined to any particular order of performance.

Nanocrystals comprising semiconductor material show strong quantum confinement effects that can be harnessed in designing bottom-up chemical approaches to create complex heterostructures with electronic and optical properties that are tunable with the size and composition of the nanocrystals.

When an electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. As discussed above, the population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. The breadth of the emission decreases as the dispersity of semiconductor nanocrystal diameters decreases. Semiconductor nanocrystals in accordance with the invention can have photoluminescence quantum efficiencies greater than about 30%, greater than about 40%, greater than about 50%.

The narrow FWHM of semiconductor nanocrystals can result in saturated color emission. This can lead to efficient lighting devices, for example, in the red parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau$~10 ns) than a typical phosphor ($\tau$>0.1 µs), enabling semiconductor nanocrystal lighting devices to operate efficiently even at high current density and high brightness.

Nanocrystals can be suitable for a variety of applications, including those disclosed in U.S. patent application Ser. No. 09/156,863, filed Sep. 18, 1998 (now U.S. Pat. No. 6,251,303), Ser. No. 09/160,454, filed Sep. 24, 1998 (now U.S. Pat. No. 6,326,144), Ser. No. 09/160,458, filed Sep. 24, 1998 (now U.S. Pat. No. 6,617,583), Ser. No. 09/350,956, filed Jul. 9, 1999 (now U.S. Pat. No. 6,803,719), and Ser. No. 10/400,908, filed Mar. 28, 2003 (U.S. Published Patent Application No. 20040023010), all of which are incorporated herein by reference in their entirety.

For example, nanocrystals comprising semiconductor material can be used in optoelectronic devices including electroluminescent devices such as light emitting diodes (LEDs) or alternating current thin film electroluminescent devices (ACTFELDs).

Light-emitting devices can be used to provide illumination. Light emitting devices also can be included, for example, in displays (e.g., flat-panel displays), screens (e.g., computer screens), and other items that require illumination. Accordingly, increases in the efficiency of a light-emitting device can improve the viability of producing emissive devices.

Light-emitting devices including nanocrystals comprising semiconductor material can be made, for example, by spin-casting a solution containing the hole transport layer (HTL) organic semiconductor molecules and the nanocrystals, where the HTL forms underneath the nanocrystal layer via phase separation (see, for example, U.S. patent application Ser. Nos. 10/400,907 and 10/400,908, both filed Mar. 28, 2003, each of which is incorporated by reference in its entirety). In certain embodiments, this phase separation technique can be used to place a monolayer of nanocrystals between an organic semiconductor HTL and electron transport layer (ETL), thereby effectively exploiting the favorable light emission properties of nanocrystals, while minimizing their impact on electrical performance. Other techniques for depositing nanocrystals include Langmuir-Blodgett techniques and drop-casting. Some techniques for depositing nanocrystals may not be well suited for all possible substrate materials, may involve use of chemicals that can affect the electrical or optical properties of the layer, may subject the substrate to harsh conditions, and/or may place constraints on the types of devices that can be grown in some way. Other techniques discussed below may be preferable if a patterned layer of nanocrystals is desired.

Preferably, nanocrystals comprising semiconductor material are processed in a controlled (oxygen-free and moisture-free) environment, preventing the quenching of luminescent efficiency during the fabrication process.

In certain embodiments, nanocrystals comprising semiconductor material (also referred to as semiconductor nanocrystals) can be deposited in a patterned arrangement. Patterned semiconductor nanocrystals can be used to form an array of pixels comprising, e.g., red, green, and blue or alternatively, red, yellow, green, blue-green, and/or blue emitting, or other combinations of distinguishable color emitting subpixels, that are energized to produce light of a predetermined wavelength.

An example of a technique for depositing a light-emitting material comprising semiconductor nanocrystals in a pattern and/or in a multi-color pattern or other array is contact printing. Contact printing advantageously allows micron-scale (e.g., less than 1 mm, less than 500 microns, less than 200 microns, less than 100 microns, less than 50 microns, less than 25 microns, or less than 10 microns) patterning of features on a surface. Pattern features can also be applied at larger scales, such as 1 mm or greater, 1 cm or greater, 1 m or greater, 10 m or greater. Contact printing can allow dry (e.g., liquid free or substantially liquid free) application of a patterned semiconductor nanocrystal layer to a surface. In a pixilated device, the semiconductor nanocrystal layer comprises a patterned array of the semiconductor nanocrystals on the underlying layer. In instances where a pixel includes subpixels, the sizes of the subpixels can be a proportionate fraction of the pixel size, based on the number of subpixels.

Additional information and methods for depositing semiconductor nanocrystals are described in U.S. patent application Ser. No. 11/253,612 entitled "Method And System For Transferring A Patterned Material", filed 21 Oct. 2005, and Ser. No. 11/253,595 entitled "Light Emitting Device Including Semiconductor Nanocrystals", filed 21 Oct. 2005, each of which is hereby incorporated herein by reference in its entirety.

A non-limiting example of an embodiment of a device including semiconductor nanocrystals in accordance with the invention can be prepared as follows.

Glass (50 mm×50 mm) with patterned indium tin oxide (ITO) electrode on one surface (e.g., obtained from Thin Film Devices, Anaheim, Calif.) is preferably cleaned in an oxygen plasma for a suitable time (e.g., about 6 minutes) to remove contaminants and oxygenate the surface. For example, the cleaning is carried out in 100% oxygen at about 20 psi. The glass can be placed on a water cooled plate to help control the increase in temperature during cleaning.

A layer of hole injection material (e.g., PEDOT, obtained from H. C. Starck, GmbH) (HIL) is spun onto the surface of the glass including the patterned electrode at a predetermined speed (e.g., 4000 RPM) to a desired thickness (e.g., about 750 Angstroms). This step can be carried out under ambient conditions (i.e., not in a glove box). Preferably, the PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (e.g., N,N'-bis(3-methylphenyl)-N,N'-bis(phenyl)-spiro (spiro-TPD) (E105—OLED grade, gradient sublimation purified) from Luminescent Technologies, Taiwan)) is then evaporated onto the PEDOT layer in a deposition chamber (an ÅMOD chamber, obtained from Angstrom Engineering, Ottowa, Canada) to a desired thickness (e.g., about 500 Angstroms) after pumping the chamber down to $10^{-6}$ torr or better.

The spiro-TPD coated glass is then returned to the nitrogen environment and stamped with an ink including nanocrystals in accordance with the invention and hexane. A typical optical density of the dispersion of the semiconductor nanocrystals in the ink can be, e.g., 0.02, although other optical densities can be selected by the skilled artisan. The ink is stamped onto the spiro-TPD layer using an unfeatured curved Parylene-C coated PDMS stamp using a pad printing machine, e.g., printing machine model XP-05 made by Pad Printing Machinery of Vermont.

After printing, the device is returned to the deposition chamber and is pumped back down to $10^{-6}$ torr or better for evaporation of the next layer, which can be a hole blocking layer or an electron transport layer.

A layer of electron transport material (e.g., LT-N820 from Luminescent Technologies, Taiwan) is deposited to a desired thickness (e.g., about 500 Angstroms).

Each of the vapor deposited layers can be patterned with use of shadow masks. After deposition of the electron transport material layer, the mask is changed before deposition of the metal cathode (e.g., LiF (5 Angstrom)/Al (1000 Angstrom)).

Alternative hole and electron transport materials, electrode materials, and layer thicknesses can be used. Optionally, additional layers and structures, as discussed herein, can also be included in a device.

A device in accordance with the invention can further include a backplane. A backplane can include active or passive electronics for controlling or switching power to individual light-emitting devices or pixels. In particular, the backplane can be configured as an active matrix, passive matrix, fixed format, direct drive, or hybrid. The device including multiple light-emitting devices or pixels can be configured for still images, moving images, or lighting.

Other materials, techniques, methods and applications that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim et al., for "Applicator For Depositing Materials And Methods" filed on 14 Apr. 2006; U.S. Provisional Patent Application 60/793,990 of LeeAnn Kim et al., for "Applicator For Depositing Materials And Methods" filed on 21 Apr. 2006; U.S. Provisional Patent Application No. 60/790,393 of Seth Coe-Sullivan et al., for "Methods And Articles Including Nanomaterial", filed on 7 Apr. 2006; U.S. Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan et al., for "Methods And Articles Including Nanomaterial", filed on 24 Jun. 2006; U.S. Provisional Patent Application No. 60/795,420 of Paul Beatty et al., for "Device Including Semiconductor Nanocrystals And A Layer Including A Doped Organic Material And Methods", filed on 27 Apr. 2006; U.S. Provisional Patent Application No. 60/804,921 of Seth Coe-Sullivan et al., for "Light-Emitting Devices And Displays With Improved Performance", filed on 15 Jun. 2006, U.S. Published Patent Application No. 20060157720 of Moungi G. Bawendi et al. for "Nanocrystals Including III-V Semiconductors"; U.S. Published Patent Application No. 2006013074 of Peng, et al., for "High Quality Colloidal Nanocrystals And Methods Of Preparing The Same In Non-Coordinating Solvents", PCT Publication No. WO/2005/002007 of Lucey, et al. for "Process For Producing Semiconductor Nanocrystal Cores, Core-Shell, Core-Buffer-Shell, And Multiple Layer Systems In A Non-Coordinating Solvent Utilizing In Situ Surfactant Generation", U.S. Pat. No. 5,505,928 of A. Paul Alivisatos, et al. for "Preparation of III-V Semiconductor Nanocrystals", U.S. Provision Patent Application No. 60/825,373, filed 12 Sep. 2006, of Seth A. Coe-Sullivan et al., for "Light-Emitting Devices And Displays With Improved Performance"; and U.S. Provision Patent Application No. 60/825,374, filed 12 Sep. 2006, of Seth A. Coe-Sullivan et al., for "Light-Emitting Devices And Displays With Improved Performance". The disclosures of each of the foregoing listed patent documents are hereby incorporated herein by reference in their entireties.

Other multilayer structures may optionally be used to improve the performance of the light-emitting devices and displays of the invention.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Semiconductor nanocrystals can be included in efficient hybrid organic/inorganic light emitting devices.

Because of the diversity of semiconductor nanocrystal materials that can be prepared, and the wavelength tuning via semiconductor nanocrystal composition, structure, and size, devices that are capable of emitting light of a predetermined color are possible with use of semiconductor nanocrystals as the emissive material. Semiconductor nanocrystal light-emitted devices can be tuned to emit anywhere in the spectrum.

Light-emitting devices can be prepared that emit visible or invisible (e.g., IR) light. The size and material of a semiconductor nanocrystal can be selected such that the semiconductor nanocrystal emits light having a predetermined wavelength. Light emission can be of a predetermined wavelength in any region of the spectrum, e.g., visible, infrared, etc. For example, the wavelength can be between 300 and 2,500 nm or greater, for instance between 300 and 400 nm, between 400 and 700 nm, between 700 and 1100 nm, between 1100 and 2500 nm, or greater than 2500 nm.

Individual light-emitting devices can be formed. In other embodiments, a plurality of individual light-emitting devices can be formed at multiple locations on a single substrate to form a display. The display can include devices that emit at the same or different wavelengths. By patterning the substrate with arrays of different color-emitting semiconductor nanocrystals, a display including pixels of different colors can be formed.

An individual light-emitting device or one or more light-emitting devices of a display can optionally include a mixture of different color-emitting semiconductor nanocrystals formulated to produce a white light. White light can alternatively be produced from a device including red, green, blue, and, optionally, additional pixels.

Examples of other displays are included in U.S. Patent Application No. 60/771,643 for "Displays Including Semiconductor Nanocrystals And Methods Of Making Same", of Seth Coe-Sullivan et al., filed 9 Feb. 2006, the disclosure of which is hereby incorporated herein by reference in its entirety.

For additional information relating to semiconductor nanocrystals and their use, see also U.S. Patent Application No. 60/620,967, filed Oct. 22, 2004, and Ser. No. 11/032,163, filed Jan. 11, 2005, U.S. patent application Ser. No. 11/071, 244, filed 4 Mar. 2005. Each of the foregoing patent applications is hereby incorporated herein by reference in its entirety. As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. A nanocrystal comprising a core comprising a first semiconductor material comprising one or more elements of Group IIIA of the Periodic Table of Elements and one or more elements of Group VA of the Periodic Table of Elements, and a shell disposed over at least a portion of a surface of the core, the shell comprising one or more additional semiconductor materials, wherein the nanocrystal is capable of emitting visible light having a photoluminescence quantum efficiency of at least about 30% upon excitation.

2. A nanocrystal in accordance with claim 1 wherein the nanocrystal is capable of emitting light including a maximum peak emission at a wavelength in the range from about 500 nm to about 700 nm upon excitation.

3. A nanocrystal in accordance with claim 1 wherein the one or more additional semiconductor materials comprise one or more elements of Group IIB of the Periodic Table of Elements and one or more elements of Group VIA of the Periodic Table of Elements.

4. A method for preparing a nanocrystal comprising a semiconductor material including one or more elements of Group IIIA of the Periodic Table of Elements and one or more elements of Group VA of the Periodic Table of Elements, the method comprising:
dispersing or dissolving one or more Group IIIA precursors in a first solvent to form one or more Group IIIA reactants, wherein the first solvent comprises a coordinating solvent and/or a non-coordinating solvent;
dispersing or dissolving one or more Group VA precursors in a second solvent to form one or more Group VA reactants;
simultaneously and separately adding the one or more Group IIIA reactants and one or more Group VA reactants to a reaction medium including a third solvent and a ligand source to form a reaction mixture; and
reacting one or more Group IIIA reactants with one or more Group VA reactants in the presence of a ligand source to form nanocrystals comprising the semiconductor material and having one or more ligands attached to at least a portion of the nanocrystals.

5. A method for preparing a nanocrystal comprising a semiconductor material including one or more elements of Group IIIA of the Periodic Table of Elements and one or more elements of Group VA of the Periodic Table of Elements, the method comprising:
dispersing or dissolving one or more Group IIIA precursors in a first solvent to form one or more Group IIIA reactants, wherein the first solvent comprises a coordinating solvent and/or a non-coordinating solvent;
dispersing or dissolving one or more Group VA precursors in a second solvent to form one or more Group VA reactants;
separately adding the one or more Group IIIA reactants and the one or more Group VA reactants to a reaction medium including a third solvent and a ligand source to form a reaction mixture, and
reacting the reaction mixture under conditions sufficient to form nanocrystals comprising the semiconductor material having a predetermined composition, predetermined size, and predetermined emission characteristics, at least a portion of the nanocrystals including one or more ligands attached thereto.

6. A method in accordance with claim 5 wherein the first solvent comprises methyl myristate.

7. A method in accordance with claim 5 wherein the first solvent comprises DowthermA.

8. A method in accordance with claim 5 wherein the first solvent comprises an ether.

9. A method in accordance with claim 5 wherein the second solvent comprises a non-coordinating solvent.

10. A method in accordance with claim 5 wherein the second solvent comprises squalane.

11. A method in accordance with claim 5 wherein the second solvent comprises octadecane.

12. A method in accordance with claim 5 wherein the third solvent comprises a non-coordinating solvent.

13. A method in accordance with claim 5 wherein the third solvent comprises squalane.

14. A method in accordance with claim 5 wherein the third solvent comprises octadecane.

15. A method in accordance with claim 5 wherein the method is carried out in an inert atmosphere.

16. A method in accordance with claim 5 wherein the ligand source comprises a carboxylic acid.

17. A method in accordance with claim 5 wherein the ligand source comprises myristic acid.

18. A method in accordance with claim 5 wherein the ligand source comprises 9-octadecenoic [oleic] acid.

19. A method in accordance with claim 5 wherein one or more Group IIIA reactants are reacted with one or more Group VA reactants in the presence of a ligand source and an amine.

20. A method in accordance with claim 5 wherein the reaction medium further includes an amine.

21. A method for preparing a nanocrystal comprising a semiconductor material comprising one or more elements of Group IIIA of the Periodic Table of Elements and one or more elements of Group VA of the Periodic Table of Elements, the method comprising dispersing or dissolving one or more Group IIIA precursors in a first solvent to form one or more Group IIIA reactants, wherein the first solvent comprises a coordinating solvent and/or a non-coordinately solvent; dispersing one or more Group VA precursors in a second solvent to form one or more Group VA reactants; mixing the one or more Group IIIA reactants and the one or more Group VA reactants to form a reaction mixture, and adding an acid to the reaction mixture to promote reaction of the reactants to form nanocrystals comprising the semiconductor material.

22. A method in accordance with claim 21 wherein an amine is included in the reaction mixture prior to the addition of the acid.

23. A method in accordance with claim 21 wherein the acid comprises a carboxylic acid.

24. A method in accordance with claim 21 wherein the acid comprises 9-octadecenoic [oleic] acid.

25. A method in accordance with claim 21 wherein the acid is dispersed in a third solvent before being added to the reaction mixture.

26. A method in accordance with claim 21 wherein the first solvent comprises methyl myristate.

27. A method in accordance with claim 21 wherein the first solvent comprises DowthermA.

28. A method in accordance with claim 21 wherein the first solvent comprises an ether.

29. A method in accordance with claim 21 wherein the second solvent comprises a non-coordinating solvent.

30. A method in accordance with claim 21 wherein the second solvent comprises octadecane.

31. A method in accordance with claim 21 wherein the second solvent comprises squalane.

32. A method in accordance with claim 25 wherein the third solvent comprises a non-coordinating solvent.

33. A method in accordance with claim 25 wherein the third solvent comprises octadecane.

34. A method in accordance with claim 25 wherein the third solvent comprises squalane.

35. A method in accordance with claim 21 wherein the method is carried out in an inert atmosphere.

36. A method in accordance with claim 5 wherein the first solvent does not include a phosphorus or nitrogen atom.

37. A method in accordance with claim 5 wherein the second solvent does not include a phosphorus or nitrogen donor atom.

38. A method in accordance with claim 21 wherein the first solvent does not include a phosphorus or nitrogen donor atom.

39. A device including a nanocrystal comprising a core comprising a first semiconductor material comprising one or more elements of Group IIIA of the Periodic Table of Elements and one or more elements of Group VA of the Periodic Table of Elements, and a shell disposed over at least a portion of a surface of the core, the shell comprising one or more additional semiconductor materials, wherein the nanocrystal is capable of emitting visible light having a photoluminescence quantum efficiency of at least about 30% upon excitation and wherein the device further includes less than 1,000 ppm Pb, less than 100 ppm Cd, and less than 1,000 ppm Hg.

40. A light emitting device comprising:
a substrate;
a first electrode adjacent to the substrate;
a second electrode opposed to the first electrode; and
a plurality of nanocrystals disposed between the first electrode and the second electrode, wherein the nanocrystals comprise a nanocrystal comprising a core comprising a first semiconductor material comprising one or more elements of Group IIIA of the Periodic Table of Elements and one or more elements of Group VA of the Periodic Table of Elements, and a shell disposed over at least a portion of a surface of the core, the shell comprising one or more additional semiconductor materials, wherein the nanocrystal is capable of emitting visible light having a photoluminescence quantum efficiency of at least about 30% upon excitation and wherein the device further includes less than 1,000 ppm Pb, less than 100 ppm Cd, and less than 1,000 ppm Hg.

41. A nanocrystal in accordance with claim 1 wherein the one or more elements of Group IIIA comprise indium.

42. A nanocrystal in accordance with claim 1 wherein the one or more elements of Group VA comprise phosphorus.

43. A nanocrystal in accordance with claim 1 wherein the core comprises InP.

44. A nanocrystal in accordance with claim 1 wherein the emitted light has a maximum peak emission with a FWHM less than 70 nm.

45. A nanocrystal in accordance with claim 1 wherein the emitted light has a maximum peak emission with a FWHM less than 60 nm.

46. A nanocrystal in accordance with claim 1 wherein the one or more additional semiconductor materials include ZnSe.

47. A nanocrystal in accordance with claim 1 wherein the one or more additional semiconductor materials include zinc and sulfur and selenium.

48. A nanocrystal in accordance with claim 1 wherein the one or more additional semiconductor materials include $ZnSe_xS_{1-x}$, wherein $0<x<1$.

49. A nanocrystal in accordance with claim 1 wherein the one or more additional semiconductor materials include $ZnSe_xS_{1-x}$, wherein x is 0.5.

* * * * *